United States Patent
Kim et al.

(10) Patent No.: US 10,559,613 B2
(45) Date of Patent: Feb. 11, 2020

(54) SEMICONDUCTOR DEVICE AND METHOD FOR FABRICATING THE SAME

(71) Applicant: SAMSUNG ELECTRONICS CO., LTD., Suwon-si, Gyeonggi-Do (KR)

(72) Inventors: Sung In Kim, Hwaseong-si (KR); Jae Kyu Lee, Seongnam-si (KR); Jae Rok Kahng, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/813,833

(22) Filed: Nov. 15, 2017

(65) Prior Publication Data
US 2018/0182795 A1    Jun. 28, 2018

(30) Foreign Application Priority Data

Dec. 28, 2016  (KR) .................. 10-2016-0180924

(51) Int. Cl.
| | |
|---|---|
| H01L 27/146 | (2006.01) |
| H01L 29/423 | (2006.01) |
| H01L 29/08 | (2006.01) |
| H01L 29/78 | (2006.01) |
| H04N 5/374 | (2011.01) |
| H04N 5/378 | (2011.01) |

(52) U.S. Cl.
CPC .. *H01L 27/14614* (2013.01); *H01L 27/14616* (2013.01); *H01L 27/14689* (2013.01); *H01L 29/0847* (2013.01); *H01L 29/4236* (2013.01); *H01L 29/7827* (2013.01); *H04N 5/374* (2013.01); *H04N 5/378* (2013.01)

(58) Field of Classification Search
None
See application file for complete search history.

(56) References Cited

U.S. PATENT DOCUMENTS

| | | | |
|---|---|---|---|
| 7,525,077 B2 | 4/2009 | Kim et al. | |
| 7,768,047 B2 | 8/2010 | Mauritzson et al. | |
| 7,825,438 B2 * | 11/2010 | Jung | ................ H01L 27/14603 257/233 |
| 8,853,606 B2 | 10/2014 | Lee et al. | |
| 9,006,080 B2 | 4/2015 | Chou et al. | |
| 9,054,003 B2 | 6/2015 | Ahn et al. | |
| 9,190,495 B2 | 11/2015 | Ryu et al. | |
| (Continued) | | | |

FOREIGN PATENT DOCUMENTS

KR    2016-005068    1/2016

*Primary Examiner* — Nishath Yasmeen
(74) *Attorney, Agent, or Firm* — F. Chau & Associates, LLC

(57) ABSTRACT

A semiconductor device and a method for fabricating the same are provided. The semiconductor device includes a substrate, first and second recesses spaced apart from each other in a first direction within the substrate, a first gate electrode filling the first recess and protruding above the substrate, a second gate electrode filling the second recess and protruding above the substrate, a first source/drain formed between the first and second recesses, a second source/drain formed in an opposite direction to the first source/drain with respect to the first recess, and a third source/drain formed in an opposite direction to the first source/drain with respect to the second recess and electrically connected to the second source/drain.

15 Claims, 21 Drawing Sheets

(56) References Cited

U.S. PATENT DOCUMENTS

| | | | |
|---|---|---|---|
| 2006/0124975 A1* | 6/2006 | Fathimulla | H01L 29/4908 257/288 |
| 2006/0124976 A1* | 6/2006 | Adkisson | H01L 27/14601 257/292 |
| 2006/0175538 A1* | 8/2006 | Kim | H01L 27/14603 250/208.1 |
| 2007/0080410 A1 | 4/2007 | Kim | |
| 2012/0104465 A1* | 5/2012 | Kim | H01L 27/14603 257/225 |
| 2012/0314109 A1* | 12/2012 | Murakami | H01L 27/14603 348/300 |
| 2013/0049082 A1 | 2/2013 | Kato et al. | |
| 2013/0256509 A1* | 10/2013 | Yang | H01L 27/14612 250/208.1 |
| 2015/0195469 A1* | 7/2015 | Kim | H04N 5/374 348/308 |

\* cited by examiner

SEMICONDUCTOR DEVICE AND METHOD FOR FABRICATING THE SAME

CROSS-REFERENCE TO RELATED APPLICATION

This application claims priority under 35 U.S.C. 119 to Korean Patent Application No. 10-2016-0180924 filed on Dec. 28, 2016 in the Korean Intellectual Property Office, the content of which in its entirety is herein incorporated by reference.

TECHNICAL FIELD

The present disclosure relates to a semiconductor device and a method for fabricating the same.

DISCUSSION OF RELATED ART

In semiconductor devices, an image sensor is a device to convert an optical image into an electric signal. The image sensor may be categorized into a charge coupled device (CCD) type, and a complementary metal oxide semiconductor (CMOS) type. The CMOS image sensor (CIS) includes a plurality of two-dimensionally arranged pixels. Each of the plurality of pixels includes a photodiode (PD), and the PD converts an incident light into an electric signal.

In recent years, rapid development in the computer and communication industries has resulted in an increased demand for the image sensors with enhanced performances in a variety of fields such as digital cameras, camcorders, personal communication systems (PCS), gaming devices, security cameras, medical micro cameras, robots, and the like. To obtain image sensors with enhanced performances, highly-integrated semiconductor devices are adopted to achieve high integration of the image sensors.

SUMMARY

The present disclosure provides a semiconductor device with enhanced operating characteristic, and a method for fabricating the same.

According to an aspect of the present disclosure, there is provided a semiconductor device including a substrate, first and second recesses spaced apart from each other in a first direction within the substrate, a first gate electrode filling the first recess and protruding above the substrate, a second gate electrode filling the second recess and protruding above the substrate, a first source/drain formed between the first and second recesses, a second source/drain formed in an opposite direction to the first source/drain with respect to the first recess, and a third source/drain formed in an opposite direction to the first source/drain with respect to the second recess.

According to another aspect of the present disclosure, there is provided a semiconductor device including a photodiode configured to output an electric signal according to incident light, a floating diffusion node electrically connected to the photodiode, a first transistor configured to apply a reset signal to the floating diffusion node, a second transistor structure configured to use voltage of the floating diffusion node as a gate voltage and a third transistor connected to the second transistor structure in series, in which the second transistor structure comprises a substrate, first and second recesses extending in parallel in a first direction within the substrate and spaced apart in a second direction intersecting the first direction, a first gate electrode filling the first recess and protruding above the substrate, a second gate electrode filling the second recess and protruding above the substrate, a first source/drain formed between the first and second recesses, a second source/drain formed in an opposite direction to the first source/drain region with respect to the first recess, and a third source/drain formed in an opposite direction to the first source/drain region with respect to the second recess.

According to still another aspect of the present disclosure, there is provided a semiconductor device including a substrate, a select gate electrode formed on the substrate, a reset gate electrode spaced apart from the select gate electrode in a first direction and formed on the substrate, a plurality of drive gate electrodes formed between the select gate electrode and the reset gate electrode, in which the plurality of drive gate electrodes fill a plurality of recesses formed within the substrate, respectively, and sources and drains formed on one side or between two adjacent ones of the plurality of drive gate electrodes, the select gate electrode, and the reset gate electrode, in which the sources and the drains are alternately disposed in the first direction, and the sources are electrically connected to each other, and the drains are electrically connected to each other.

According to still another aspect of the present disclosure, there is provided a method for fabricating a semiconductor device including forming first and second recesses extending in parallel in a first direction within a substrate and spaced apart in a second direction intersecting the first direction, forming first to third source/drains on side surfaces of the first and second recesses, in which the second source/drain is disposed between the first and third source/drains, forming first and second gate electrodes filling the first and second recesses and protruding above the substrate, respectively, electrically connecting the first and third source/drains to each other, and electrically connecting the first and second gate electrodes to each other.

According to still another aspect of the present disclosure, there is provided a semiconductor device including a substrate, a first gate electrode formed on the substrate, the first gate electrode including a first lower gate electrode filling a first recess within the substrate and a first upper gate electrode protruding above the substrate, a first source/drain and a second source/drain formed within the substrate on each side of the first gate electrode, a second gate electrode formed on a side of the second source/drain with the second source/drain interposed between the first gate electrode and the second gate electrode, the second gate electrode including a second lower gate electrode filling a second recess within the substrate and a second upper gate electrode protruding above the substrate, and a third source/drain formed on a side of the second gate electrode with the second gate electrode interposed between the second source/drain and the third source/drain, in which the first source/drain is electrically connected to the third source/drain, and the first upper gate electrode and the second upper gate electrode are directly connected to each other, or connected to each other through a connection part.

BRIEF DESCRIPTION OF THE DRAWINGS

The above and other features of the present disclosure will become more apparent to those of ordinary skill in the art by describing in detail exemplary embodiments thereof with reference to the accompanying drawings, and in which.

Figure 1:
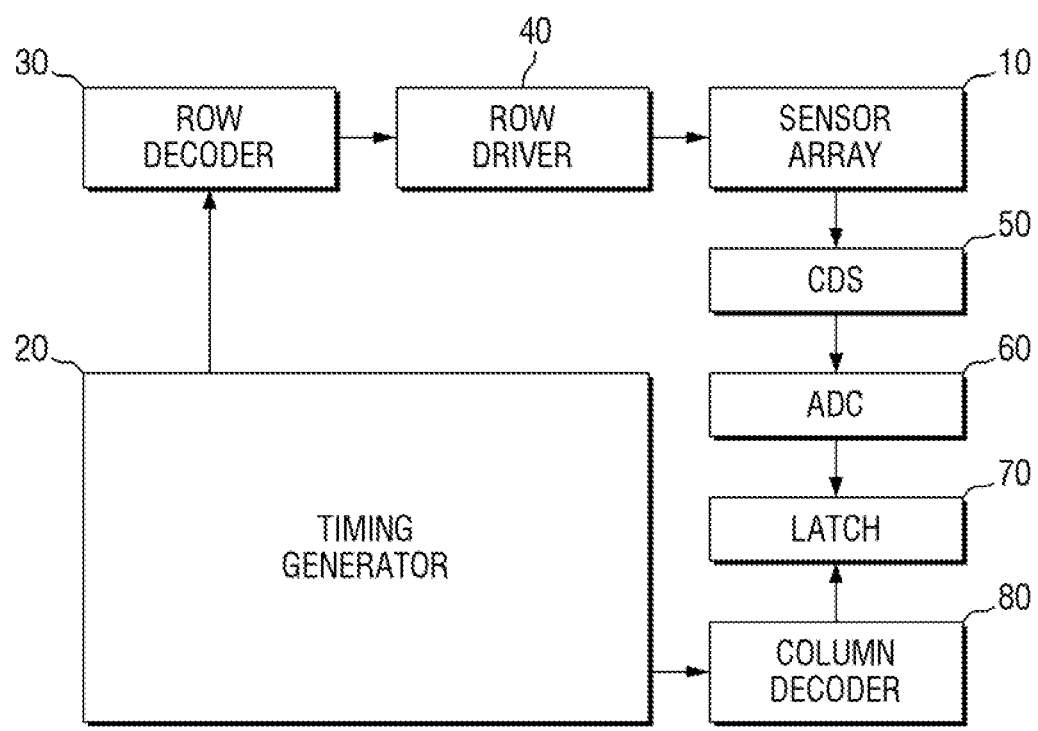
FIG. 1 is a block diagram provided to explain a semiconductor device according to an exemplary embodiment of the present disclosure.

Since the drawings in FIGS. 1-21 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, a semiconductor device according to an exemplary embodiment of the present disclosure will be described with reference to FIGS. 1 to 5.

Figure 2:
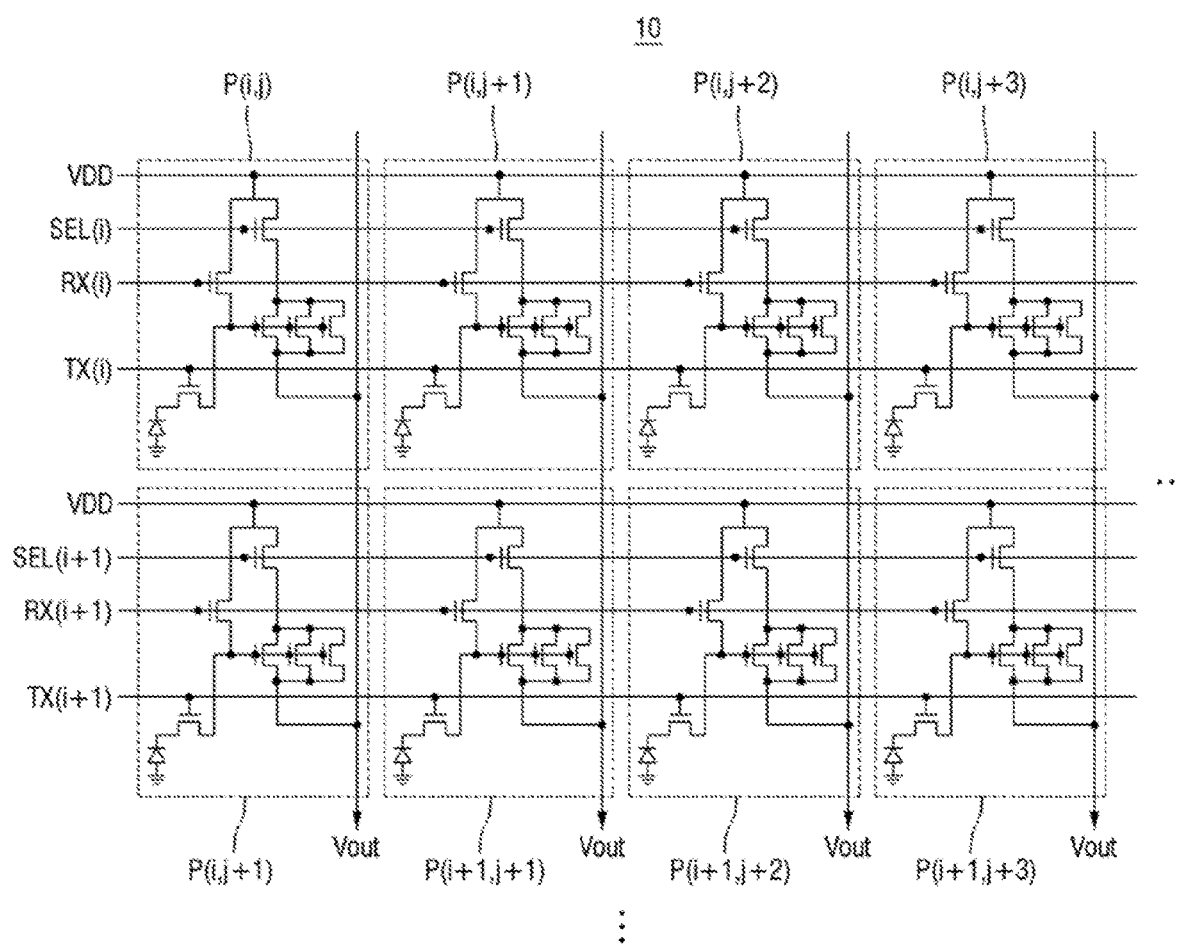
FIG. 2 is an equivalent circuit view of the sensor array of FIG. 1.
Figure 3:
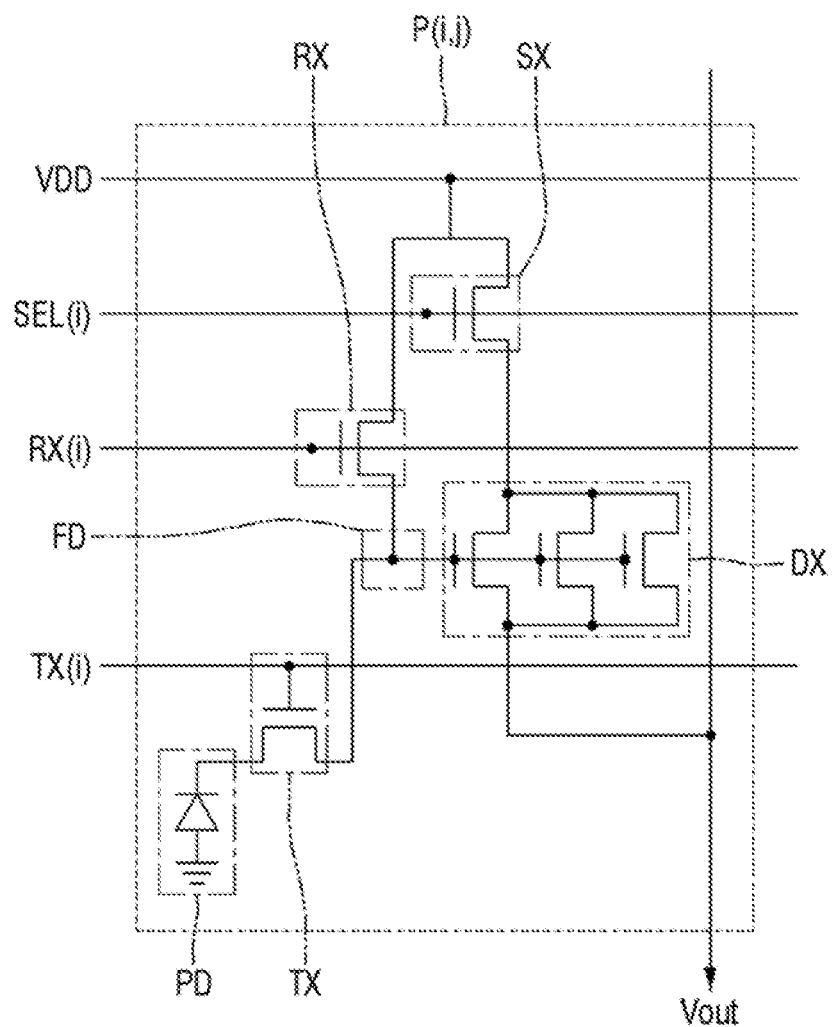
FIG. 3 is an enlarged equivalent circuit view provided to explain in detail one of the pixels of FIG. 2.
Figure 4:
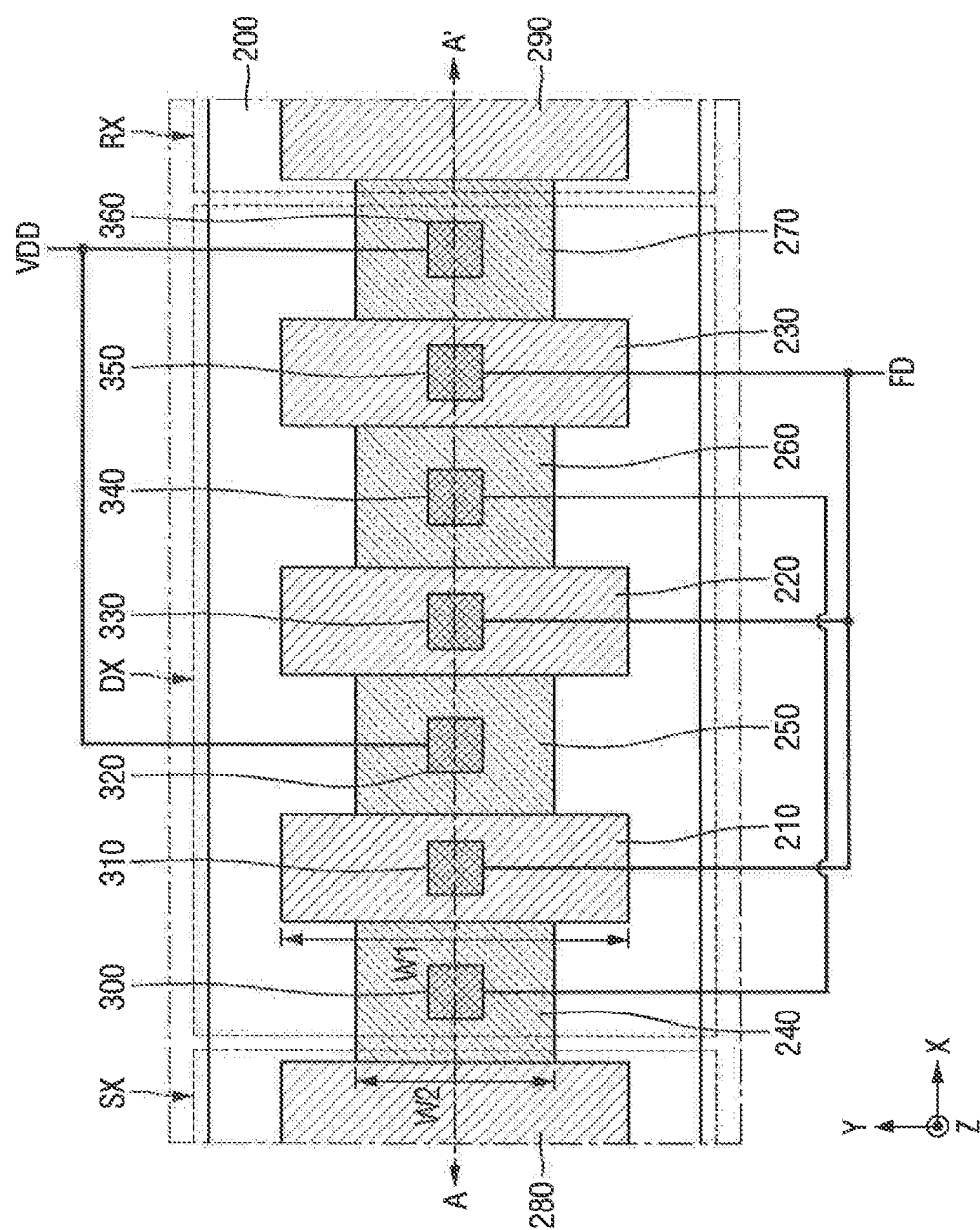
FIG. 4 is a layout view provided to explain a semiconductor device according to an exemplary embodiment of the present disclosure.
Figure 5:
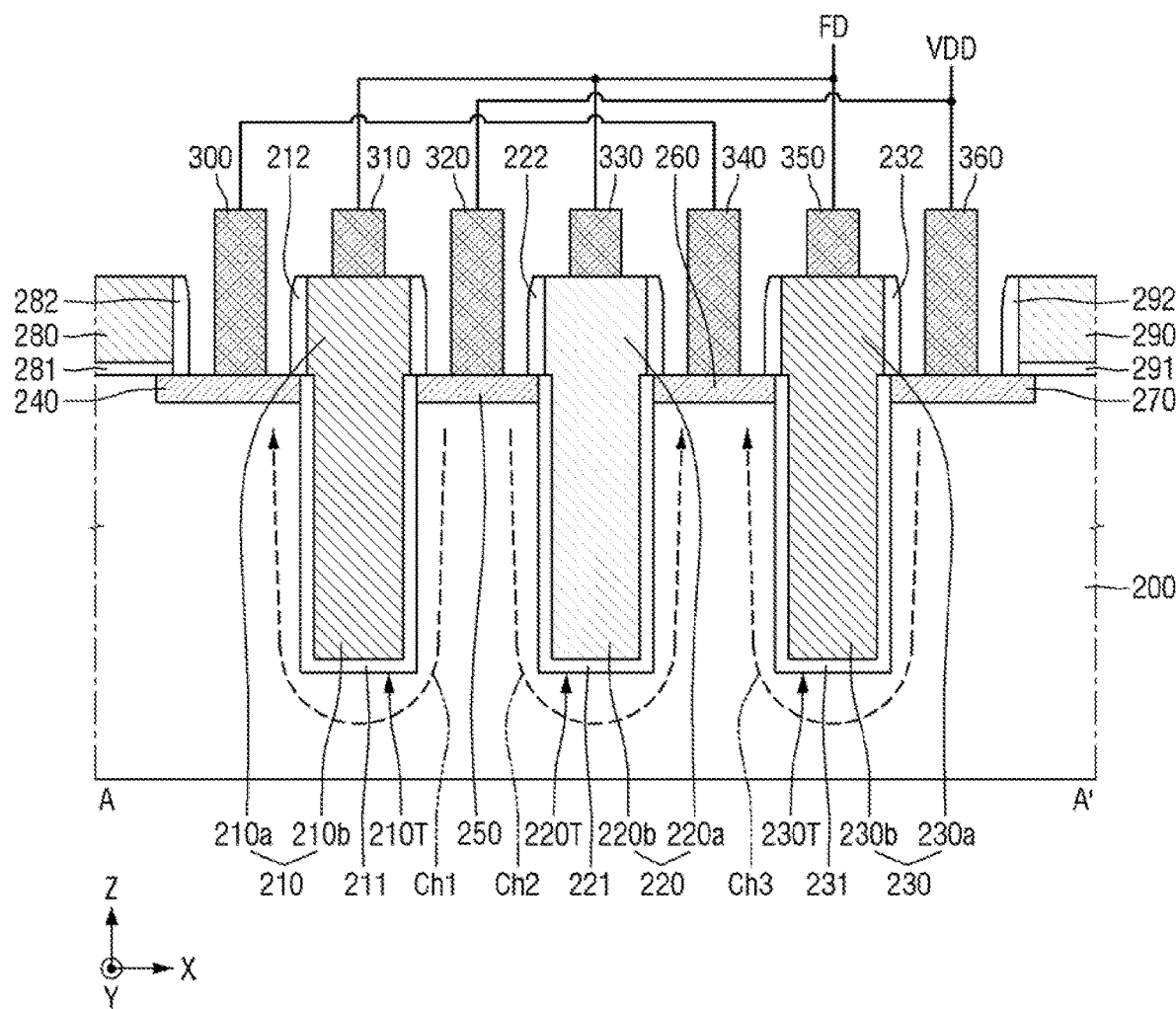
FIG. 5 is a cross sectional view taken along line A-A' of FIG. 4.

FIG. 1 is a block diagram provided to explain a semiconductor device according to an exemplary embodiment of the present disclosure, and FIG. 2 is an equivalent circuit view of the sensor array of FIG. 1. FIG. 3 is an enlarged equivalent circuit view provided to explain in detail one of the pixels of FIG. 2, and FIG. 4 is a top view provided to explain a semiconductor device according to an exemplary embodiment of the present disclosure. FIG. 5 is a cross sectional view taken along line A-A' of FIG. 4.

Referring to FIG. 1, an image sensor according to an exemplary embodiment of the present disclosure includes a sensor array 10 composed of two-dimensionally arranged pixels each including photoelectric devices, a timing generator 20, a row decoder 30, a row driver 40, a correlated double sampler (CDS) 50, an analog to digital converter (ADC) 60, a latch 70, a column decoder 80, and so on.

The sensor array 10 includes a plurality of two-dimensionally arranged unit pixels. The plurality of unit pixels serve to convert optical images into electric output signals. The sensor array 10 receives a plurality of driving signals including row-select signal, reset signal, charge transmission signal, and so on from the row driver 40, such that the sensor array 10 is driven accordingly. Further, the converted electric output signal is provided to the correlated double sampler (CDS) 50 through vertical signal lines. The plurality of unit pixels may include CMOS image pixels.

The timing generator 20 provides a timing signal and a control signal to the row decoder 30 and the column decoder 80.

The row driver 40 provides the active pixel sensor array 10 with a plurality of driving signals to drive the plurality of unit pixels according to the decoding result of the row decoder 30. Generally, the driving signals are provided to each row when the unit pixels are arranged in a matrix form.

The correlated double sampler (CDS) 50 receives an output signal formed at the active pixel sensor array 10 through a vertical signal line, and holds and samples the received signal. That is, the correlated double sampler (CDS) 50 double-samples a certain noise level and a signal level of the output signal, and outputs a difference level corresponding to a difference between the noise level and the signal level.

The analog to digital converter (ADC) 60 converts an analog signal corresponding to the difference level into a digital signal, and output the digital signal.

The latch 70 latches the digital signal, and the latched signal is sequentially outputted to an image signal processor according to the decoding result of the column decoder 80.

Referring to FIGS. 2 and 3, pixels P are arranged into a matrix form to constitute the sensor array 10. Each of the pixels P includes a photoelectric transistor PD, a floating diffusion region (or node) FD, a charge transfer transistor TX, a drive transistor DX, a reset transistor RX, and a select transistor SX. The functions of those mentioned above will be described with reference to i-th row pixel (P(i, j), P(i, j+1), P(i, j+2), P(i, j+3), . . . ) as an example.

The photoelectric transistor PD absorbs incident light and accumulates charges according to the quantity of light absorbed. For the photoelectric transistor PD, photodiode, phototransistor, photogate, pinned photodiode or a combination thereof may be applied, although the photodiode is illustrated in the drawings as an example.

Each photoelectric transistor PD is coupled with each charge transfer transistor TX that transfers the accumulated charges generated by the photoelectric transistor PD to the floating diffusion region FD. The floating diffusion region FD is a region where the charges are converted into voltages, and because of the parasitic capacitance, the charges are cumulatively stored.

The drive transistor DX, exemplified herein as a source follower amplifier, amplifies a change in the electrical potential in the floating diffusion region FD which receives the accumulated charges from each photoelectric transistor PD, and outputs the amplified result to an output line Vout. That is, the drive transistor DX may be configured to use the voltage of the floating diffusion node FD as a gate voltage.

The reset transistor RX periodically resets the charges stored in the floating diffusion region FD. The reset transistor RX has a drain connected to a power voltage VDD terminal, a source connected to the floating diffusion node FD. The reset transistor RX may be composed of one metal oxide semiconductor (MOS) transistor that is driven by the bias provided by a reset line RX(i) for applying a predetermined bias (i.e., reset signal). When the reset transistor RX is turned on by the bias provided by the reset line RX(i), a predetermined electrical potential provided to a drain of the reset transistor RX, e.g., a power voltage VDD, is transmitted to the floating diffusion region FD. That is, the floating diffusion region FD is reset to the power voltage VDD.

The select transistor SX plays a role of selecting a pixel P to be read in a row unit. The select transistor SX may be composed of one MOS transistor that is driven by the bias (i.e., row select signal) provided by a row select line SEL(i). The select transistor SX may have a source connected to a drain of the drive transistor DX, a drain connected to the power voltage VDD terminal, and a gate connected to the row select line SEL(i). That is, the select transistor SX may be connected to the drive transistor DX in series. When the select transistor SX is turned on by the bias provided by the row select line SEL(i), a predetermined electrical potential provided to the drain of the select transistor SX, e.g., the power voltage VDD, is transmitted to the drain region of the drive transistor DX.

The transfer line TX(i) to apply the bias to the charge transfer transistor TX, the reset line RX(i) to apply the bias to the reset transistor RX, and the row select line SEL(i) to apply the bias to the select transistor SX may be arranged in column direction and may extend substantially in parallel with each other in row direction.

In an example, a plurality of transistors are connected in parallel in the drive transistor DX. Although the drive transistor DX illustrated in FIG. 3 includes three transistors connected in parallel as an exemplary embodiment of the present disclosure, however, the present disclosure is not limited thereto. That is, the drive transistor DX may include a plurality of transistors connected in parallel, and there is no limitation on the number of the transistors being connected as long as the number is two or more.

Referring to FIGS. 4 and 5, the semiconductor device according to an exemplary embodiment of the present disclosure includes a substrate 200, first to third gate electrodes 210, 220, 230, first to fourth source/drains 240, 250, 260, 270, a select gate electrode 280, a reset gate electrode 290, first to third gate contacts 310, 330, 350, and first to fourth source/drain contacts 300, 320, 340, 360.

The substrate 200 may be, for example, a bulk silicon (Si) or a silicon-on-insulator (SOI). Alternatively, the substrate 200 may include other material such as, for example, silicon germanium (SiGe), indium antimonide (InSb), lead telluride (PbTe), indium arsenide (InAs), indium phosphide (InP), gallium arsenide (GaAs), gallium phosphide (GaP), or gallium antimonide (GaSb). Alternatively, the substrate 200 may be a base substrate having an epitaxial layer formed thereon. The epitaxial layer may include one of the above described materials.

The drive transistor DX, the select transistor SX and the reset transistor RX may be formed on the substrate 200. In an example, the drive transistor DX and the select transistor SX may share the first source/drain 240. Further, the drive transistor DX and the reset transistor RX may share the fourth source/drain 270.

Although drawings illustrate that both of the first source/drain 240 and the fourth source/drain 270 belong to the drive transistor DX, the first source/drain 240 may also belong to the select transistor SX and the fourth source/drain 270 may also belong to the reset transistor RX.

The first to third gate electrodes 210, 220, 230 may extend in a second direction Y. The first to third gate electrodes 210, 220, 230 may be spaced apart from one another in a first direction X. Accordingly, the first to third gate electrodes 210, 220, 230 may extend in parallel to the second direction Y. As used above, the expression, "extend . . . in(to) . . . direction," may indicate extending in an extending direction of a longer side.

In the case described above, the first direction X and the second direction Y may be orthogonal to each other. Further, a third direction Z may be orthogonal to the first direction X and the second direction Y. However, the present disclosure is not limited thereto.

When the first to third gate electrodes 210, 220, 230 are formed to be a rectangular shape as illustrated in the drawings (e.g., FIG. 4), they may include a relatively longer side and a relatively shorter side, but the present disclosure is not limited thereto. In an example, long sides of the first to third gate electrodes 210, 220, 230 may extend in the second direction Y and short sides of the first to third gate electrodes 210, 220, 230 may extend in the first direction X. As used herein, the expression, "first to third gate electrodes 210, 220, 230 may extend in the second direction Y," may indicate that long sides of the first to third gate electrodes 210, 220, 230 may extend in the second direction Y.

The first to third gate electrodes 210, 220, 230 may have the same length in the second direction Y. Further, the length may also be defined as a width in the second direction Y. That is, the first to third gate electrodes 210, 220, 230 may have the same width as a first width W1 in the second direction Y.

The second gate electrode 220 may be positioned between the first gate electrode 210 and the third gate electrode 230.

The substrate 200 may include first to third recesses 210T, 220T, 230T formed in a depth direction, the third direction Z. The first recess 210T may be formed with the first gate electrode 210, and the second recess 220T may be formed with the second gate electrode 220. The third recess 230T may be formed with the third gate electrode 230.

The first gate electrode 210 may include a first upper gate electrode 210a and a first lower gate electrode 210b. The first lower gate electrode 210b may be a portion filling the first recess 210T, and the first upper gate electrode 210a may be a portion protruding above the substrate 200. That is, the portion of the first gate electrode 210 lower than the upper surface of the substrate 200 is the first lower gate electrode 210b, and the portion of the first gate electrode 210 higher than the upper surface of the substrate 200 is the first upper gate electrode 210a. As illustrated, a width in the first direction X of the first upper gate electrode 210a may be greater than that of the first lower gate electrode 210b, but the present disclosure is not limited thereto.

The second gate electrode 220 may include a second upper gate electrode 220a and a second lower gate electrode 220b. The second lower gate electrode 220b may be a portion filling the second recess 220T, and the second upper gate electrode 220a may be a portion protruding above the substrate 200. That is, the portion of the second gate electrode 220 lower than the upper surface of the substrate 200 is the second lower gate electrode 220b, and the portion of the second gate electrode 220 higher than the upper surface of the substrate 200 is the second upper gate electrode 220a. As illustrated, a width of the second upper gate electrode 220a in the first direction X may be greater than that of the second lower gate electrode 220b, but the present disclosure is not limited thereto.

The third gate electrode 230 may include a third upper gate electrode 230a and a third lower gate electrode 230b. The third lower gate electrode 230b may be a portion filling the third recess 230T, and the third upper gate electrode 230a may be a portion protruding above the substrate 200. That is, the portion of the third gate electrode 230 lower than the upper surface of the substrate 200 is the third lower gate electrode 230b, and the portion of the third gate electrode 230 higher than the upper surface of the substrate 200 is the third upper gate electrode 230a. As illustrated, a width of the third upper gate electrode 230a in the first direction X may be greater than that of the third lower gate electrode 230b, but the present disclosure is not limited thereto.

The first to third gate electrodes 210, 220, 230 may include a conductor. For example, the first to third gate electrodes 210, 220, 230 may include polysilicon or a metal. Alternatively, the first to third gate electrodes 210, 220, 230 may include, for example, a conductive nitride, a conductive metal oxide, a conductive metal oxynitride or the like, but the present disclosure is not limited thereto.

A first gate insulating film 211 may be formed along a bottom surface and an inner sidewall surface of the first recess 210T. Accordingly, a lower surface and an outer sidewall surface of the first lower gate electrode 210b may be in contact with the first gate insulating film 211. Likewise, a second gate insulating film 221 may be formed along a bottom surface and an inner sidewall surface of the second recess 220T. Accordingly, a lower surface and an outer sidewall surface of the second lower gate electrode 220b may be in contact with the second gate insulating film 221.

A third gate insulating film 231 may be formed along a bottom surface and an inner sidewall surface of the third recess 230T. Accordingly, a lower surface and an outer sidewall surface of the third lower gate electrode 230b may be in contact with the third gate insulating film 231.

The first to third gate insulating films 211, 221, 231 may include silicon oxide ($SiO_2$), or may include other material such as, for example, silicon nitride (SiN), silicon oxynitride (SiON) or a high-k dielectric material with a dielectric constant higher than that of silicon oxide.

A first gate spacer 212 may be formed on a sidewall surface of the first upper gate electrode 210a. A second gate spacer 222 may be formed on a sidewall surface of the second upper gate electrode 220a. A third gate spacer 232 may be formed on a sidewall surface of the third upper gate electrode 230a.

The first to third gate spacers 212, 222, 232 may include at least one of, for example, silicon oxide ($SiO_2$), silicon nitride (SiN), and silicon oxynitride (SiON). However, the present disclosure is not limited thereto. As exemplified in the drawings, the first to third gate spacers 212, 222, 232 may be a single film, but may also be multi-spacers where a plurality of films are stacked. Shapes of the single spacers forming the first to third gate spacers 212, 222, 232 and shapes of the multi-spacers forming the first to third gate spacers 212, 222, 232 may each be an I- or an L-shape, or a combination thereof depending on fabrication process or purpose of use.

The select gate electrode 280 may be formed on a position adjacent to the first gate electrode 210. The reset gate electrode 290 may be formed on a position adjacent to the third gate electrode 230. Accordingly, the select gate electrode 280, the first to third gate electrodes 210, 220, 230 and the reset gate electrode 290 may be sequentially arranged in the first direction X.

A height of the select gate electrode 280 may be the same as that of the first to third gate electrodes 210, 220, 230. Likewise, a height of the reset gate electrode 290 may be the same as that of the first to third gate electrodes 210, 220, 230.

Lengths of the select gate electrode 280, the reset gate electrode 290, and the first to third gate electrodes 210, 220, 230 in the second direction Y may be the same as each other.

A select gate insulating film 281 may be formed on the substrate 200. The select gate insulating film 281 may be formed between the select gate electrode 280 and the substrate 200. The select gate insulating film 281 may include silicon oxide ($SiO_2$), or may include other material such as, for example, silicon nitride (SiN), silicon oxynitride (SiON) or a high-k dielectric material with a dielectric constant higher than that of silicon oxide.

A select gate spacer 282 may be formed on sidewall surfaces of the select gate insulating film 281 and the select gate electrode 280. The select gate spacer 282 may include at least one of, for example, silicon oxide ($SiO_2$), silicon nitride (SiN) and silicon oxynitride (SiON). However, the present disclosure is not limited thereto.

A reset gate insulating film 291 may be formed on the substrate 200. The reset gate insulating film 291 may be formed between the reset gate electrode 290 and the substrate 200. The reset gate insulating film 291 may include silicon oxide ($SiO_2$), or may include other material such as, for example, silicon nitride (SiN), silicon oxynitride (SiON) or a high-k dielectric material with a dielectric constant higher than that of silicon oxide.

A reset gate spacer 292 may be formed on sidewall surfaces of the reset gate insulating film 291 and the reset gate electrode 290. The reset gate spacer 292 may include at least one of, for example, silicon oxide ($SiO_2$), silicon nitride (SiN) and silicon oxynitride (SiON). However, the present disclosure is not limited thereto.

The first to fourth source/drains 240, 250, 260, 270 may each be formed between two adjacent ones of the select gate electrode 280, the first to third gate electrodes 210, 220, 230, and the reset gate electrode 290. Specifically, the first source/drain 240 may be formed between the first gate electrode 210 and the select gate electrode 280. The second source/drain 250 may be formed between the first gate electrode 210 and the second gate electrode 220. The third source/drain 260 may be formed between the second gate electrode 220 and the third gate electrode 230. The fourth source/drain 270 may be formed between the third gate electrode 230 and the reset gate electrode 290.

The first source/drain 240 may be in contact with lower surfaces of the select gate spacer 282 and the select gate insulating film 281. However, the present disclosure is not limited thereto. Likewise, the fourth source/drain 270 may be in contact with lower surfaces of the reset gate spacer 292 and the reset gate insulating film 291. However, the present disclosure is not limited thereto.

The first to fourth source/drains 240, 250, 260, 270 may have a second width W2 in the second direction Y, which may be smaller than the first width W1. A depth of the lower surfaces of the first to fourth source/drains 240, 250, 260, 270 may be smaller than that of the first to third recesses.

First to third gate contacts 310, 330, 350 may be formed on the first to third gate electrodes 210, 220, 230. Specifically, the first gate contact 310 may be formed on the first gate electrode 210, the second gate contact 330 may be formed on the second gate electrode 220, and the third gate contact 350 may be formed on the third gate electrode 230.

First to fourth source/drain contacts 300, 320, 340, 360 may be formed on the first to fourth source/drains 240, 250, 260, 270. Specifically, the first source/drain contact 300 may be formed on the first source/drain 240, and the second source/drain contact 320 may be formed on the second source/drain 250. Further, the third source/drain 340 may be formed on the third source/drain 260, and the fourth source/drain contact 360 may be formed on the fourth source/drain 270.

The first to fourth source/drains 240, 250, 260, 270 may be formed by doping impurity such as phosphorus (P) into a silicon layer. The process of doping impurities into a silicon layer may be achieved through ion implantation.

A height of upper surfaces of the first to third gate contacts 310, 330, 350 may be the same as that of upper surfaces of the first to fourth source/drain contacts 300, 320, 340, 360. That is, the upper surfaces of the first to third gate contacts 310, 330, 350 and the first to fourth source/drain contacts 300, 320, 340, 360 may be all flush with each other. The same height may be provided for facilitating connection of the contacts with the wires formed on upper portions of the contacts.

The drive transistor DX of FIGS. 2 and 3 may include the first to third gate electrodes 210, 220, 230 and the first to fourth source/drains 240, 250, 260, 270. In this case, the three transistors may be connected in parallel.

The first gate electrode 210 and the second gate electrode 220 may share the second source/drain 250, and the second gate electrode 220 and the third gate electrode 230 may share the third source/drain 260. Further, the first gate electrode 210 and the select gate electrode 280 may share the first source/drain 240, and the third gate electrode 230 and the reset gate electrode 290 may share the fourth source/drain 270.

The second source/drain 250 and the fourth source/drain 270 may be connected to each other and with application of the power voltage VDD, and may form a common drain region. The first source/drain 240 and the third source/drain 260 may be connected to each other to form a common source region. That is, the sources and the drains may be alternately disposed in the first direction X, in which the sources may be electrically connected to each other and the drains may be electrically connected to each other. The first to third gate electrodes 210, 220, 230 may be connected to each other, and connected to the floating diffusion region FD. Accordingly, the drive transistor DX may satisfy an equivalent circuit where the three transistors are connected in parallel. In addition, a fifth source/drain may be formed on a side surface of the select gate electrode 280, and the fifth source/drain may be electrically connected to the first to third gate electrodes 210, 220, 230.

As described above, the three transistors are illustrated, but this is provided only for illustrative purpose. That is, an equivalent circuit may include a larger number of gate electrodes and source/drains, so that a larger number of transistors may be connected in parallel.

Electric connection between the gate electrode and the source/drain may be formed by the first to third gate contacts 310, 330, 350 and the first to fourth source/drain contacts 300, 320, 340, 360. Specifically, the parallel connection may be formed by an upper interconnect structure of the first to third gate contacts 310, 330, 350 and the first to fourth source/drain contacts 300, 320, 340, 360.

The semiconductor device according to an exemplary embodiment of the present disclosure may be a semiconductor device in consideration of two performance parameters of the drive transistor DX. First, transconductance $g_m$ of the drive transistor DX may be related to high speed operation of the image sensor. Secondly, a random telegraph signal RTS of the drive transistor DX may be related to noise characteristic of the image sensor. Low transconductance may impede the operating speed and large amount of the RTS noise may reduce the sensitivity of the image sensor.

Transconductance of the drive transistor DX may be proportional to a channel width of the drive transistor DX in the second direction Y, and inversely proportional to a channel length in the first direction X. Alternatively, RTS of the drive transistor DX may be proportional to both of a channel width in the second direction Y and a channel length in the first direction X.

In an exemplary embodiment of the present disclosure, the drive transistor DX is formed such that a plurality of transistors may be connected in parallel so as to increase the transconductance for high speed operation of the image sensor. That is, as the number of parallel connections increases, an equivalent circuit has the effect as if it has an increased channel width in the second direction Y. Therefore, the transconductance of the drive transistor DX may be enhanced.

As the case described above, because one gate electrode should be branched into several parts, a channel length in the first direction X may be reduced within a predetermined space as the number of the source/drains increases. Accordingly, noise RTS characteristic of the image sensor may be degraded.

To prevent the degradation of the RTS characteristic, the semiconductor device according to an exemplary embodiment of the present disclosure may form the first to third gate electrodes 210, 220, 230 in the first to third recesses 210T, 220T, 230T. As a result, lengths of the first to third channels Ch1-Ch3 increase as the first to third channels Ch1-Ch3 detour downward, and therefore, the RTS characteristic may not be degraded.

According to an exemplary embodiment of the present disclosure, a semiconductor device including the image sensor with enhanced operating characteristic may be provided, because the transconductance of the drive transistor DX can be enhanced and the RTS performance thereof can be maintained.

Hereinbelow, a semiconductor device according to an exemplary embodiment of the present disclosure will be described with reference to FIG. 6. In the following description, description overlapped with the exemplary embodiments already provided above will not be described or described briefly for the sake of brevity.

Figure 6:
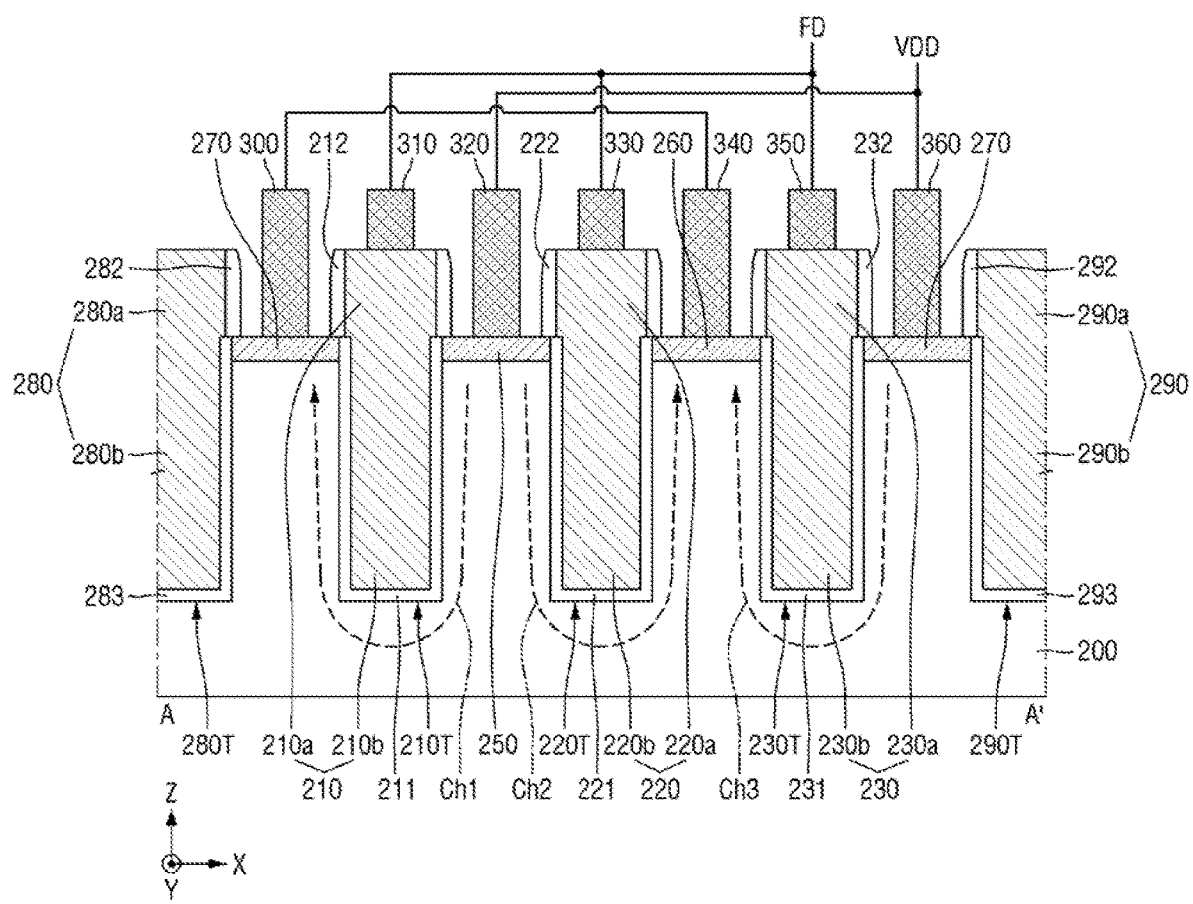
FIG. 6 is a cross sectional view provided to explain a semiconductor device according to an exemplary embodiment of the present disclosure.

FIG. 6 is a cross sectional view provided to explain a semiconductor device according to an exemplary embodiment of the present disclosure.

Referring to FIG. 6, the semiconductor device according to an exemplary embodiment of the present disclosure may be formed in a shape where the select gate electrode 280 and the reset gate electrode 290 are also formed in a recessed shape.

The substrate 200 may include a fourth recess 280T and a fifth recess 290T.

The fourth recess 280T may be formed on one side of the first recess 210T. That is, the first recess 210T may be formed in the first direction X between the fourth recess 280T and the second recess 220T. The fifth recess 290T may be formed on one side of the third recess 230T. That is, the third recess 230T may be formed in the first direction X between the second recess 220T and the fifth recess 290T. In other words, the fourth recess 280T may be formed on one side of the first to third recesses 210T, 220T, 230T, and the fifth recess 290T may be formed on the other side of the first to third recesses 210T, 220T, 230T in the first direction.

The select gate electrode 280 may include an upper select gate electrode 280a and a lower select gate electrode 280b. The lower select gate electrode 280b may be a portion filling the fourth recess 280T and the upper select gate electrode 280a may be a portion protruding above the substrate 200. That is, the portion of the select gate electrode 280 lower than the upper surface of the substrate 200 is the lower select gate electrode 280b, and the portion of the select gate electrode 280 higher than the upper surface of the substrate 200 is the upper select gate electrode 280a. As illustrated, a width of the upper select gate electrode 280a in the first direction X may be greater than that of the lower select gate electrode 280b, but the present disclosure is not limited thereto.

The reset gate electrode 290 may include an upper reset gate electrode 290a and a lower reset gate electrode 290b. The lower reset gate electrode 290b may be a portion filling the fifth recess 290T and the upper reset gate electrode 290a may be a portion protruding above the substrate 200. That is, the portion of the reset gate electrode 290 lower than the upper surface of the substrate 200 is the lower reset gate electrode 290b, and the portion of the reset gate electrode 290 higher than the upper surface of the substrate 200 is the upper reset gate electrode 290a. As illustrated, a width of the upper reset gate electrode 290a in the first direction X may be greater than that of the lower reset gate electrode 290b, but the present disclosure is not limited thereto.

The select gate insulating film 283 may be formed along a bottom surface and an inner sidewall surface of the fourth recess 280T. Accordingly, a lower surface and an outer sidewall surface of the lower select gate electrode 280b may be in contact with the select gate insulating film 283. Likewise, the reset gate insulating film 293 may be formed along a bottom surface and an inner sidewall surface of the fifth recess 290T. Accordingly, a lower surface and an outer sidewall surface of the lower reset gate electrode 290b may be in contact with the reset gate insulating film 293.

In the semiconductor device according to an exemplary embodiment of the present disclosure, the select transistor SX and the reset transistor RX as well as the drive transistor DX may include the gate electrode formed in a recessed shape on the substrate instead of the gate electrode stacked on the substrate 200. The length of the gate electrode formed in a recessed shape may decrease in the first direction X in the actual occupying space as a length of the channel region increases. The length of the channel region may increase as the channel detour downward along the recess.

An area occupied by the drive transistor DX and a length thereof in the first direction X may relatively increase compared to an existing structure (e.g., exemplary embodiments of FIGS. 1 to 5). Accordingly, the number of the parallel transistors forming the drive transistor DX may be increased to a maximum, and a channel length in the first direction X may be further extended. Accordingly, high speed operation and RTS characteristic of the image sensor of the semiconductor device according to an exemplary embodiment of the present disclosure may be enhanced.

Hereinbelow, a semiconductor device according to an exemplary embodiment of the present disclosure will be described with reference to FIG. 7. In the following description, description overlapped with the exemplary embodiments already provided above will not be described or described briefly for the sake of brevity.

Figure 7:
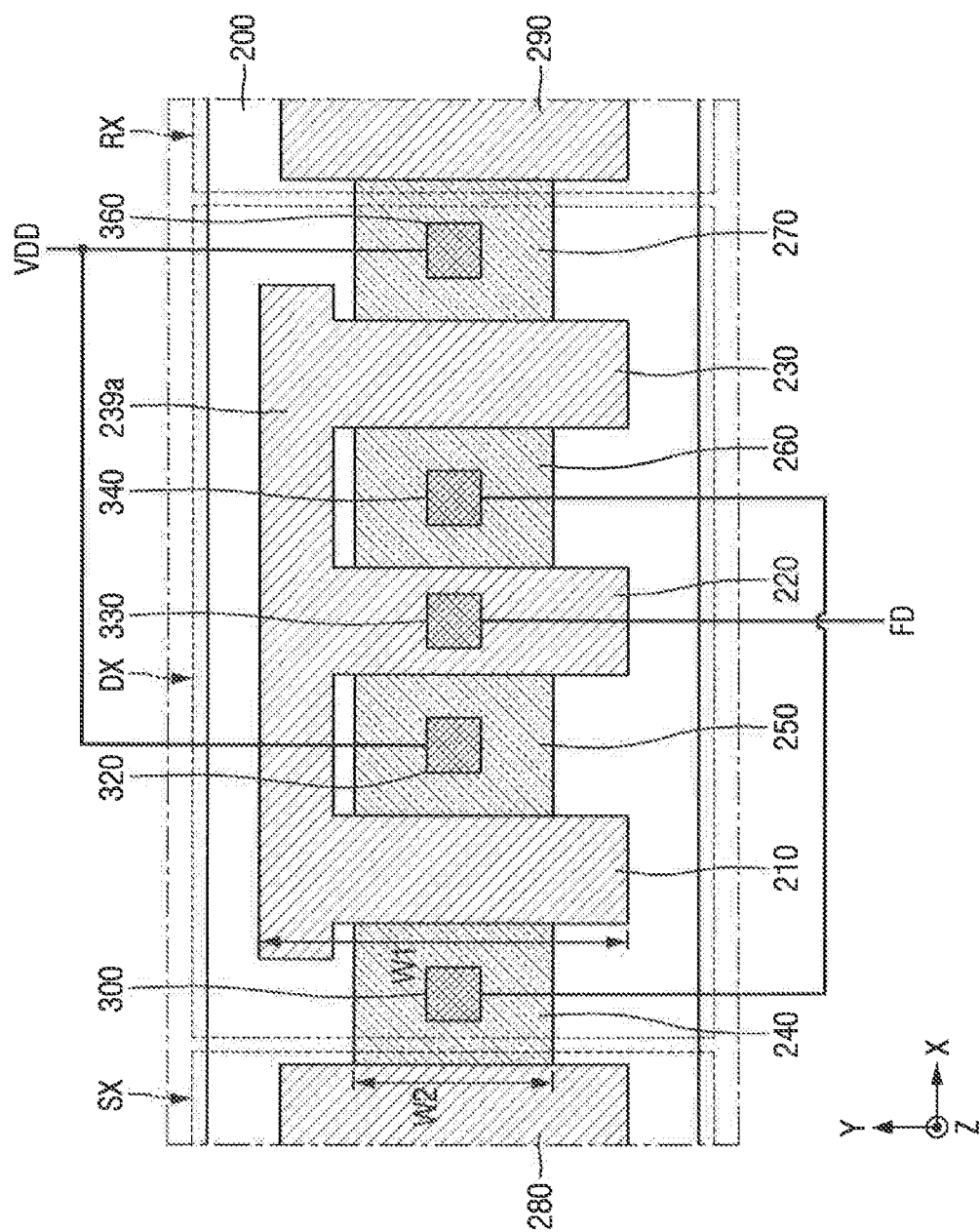
FIG. 7 is a layout view provided to explain a semiconductor device according to an exemplary embodiment of the present disclosure.

FIG. 7 is a layout view provided to explain a semiconductor device according to an exemplary embodiment of the present disclosure.

Referring to FIG. 7, the semiconductor device according to an exemplary embodiment of the present disclosure further includes a first connecting part 239a which connects the first to third gate electrodes 210, 220, 230 as one.

The first connecting part 239a may connect the first to third gate electrodes 210, 220, 230 as one. The first connecting part 239a and the first to third gate electrodes 210, 220, 230 may be formed as one integral structure without being separated from each other. That is, the first connecting part 239a and the first to third gate electrodes 210, 220, 230 may be formed as one integral structure in the same process. Thus, the first connecting part 239a and the first to third gate electrodes 210, 220, 230 may include the same material.

The first connecting part 239a may be formed on one side surface of the first to fourth source/drains 240, 250, 260, 270 in the second direction Y. Specifically, the first connecting part 239a may be formed to entirely overlap the second source/drain 250 and the third source/drain 260 in the second direction Y. Further, the first connecting part 239a may be formed to overlap a portion of the first source/drain 240 and the fourth source/drain 270 in the second direction Y. However, the present disclosure is not limited thereto. That is, unlike the illustration, the first connecting part 239a may not overlap the first source/drain 240 and the fourth source/drain 270 in the second direction Y. The first connecting part 239a may not overlap the first to fourth source/drains 240, 250, 260, 270 in the third direction Z.

In an example, the first connecting part 239a may be formed on the substrate 200. The first connecting part 239a may have an upper surface having the same height as the upper surfaces of the first upper gate electrode 210a, the second upper gate electrode 220a, and the third upper gate electrode 230a. The first connecting part 239a may connect the first to third upper gate electrodes 210a, 220a, 230a. Alternatively, in an exemplary embodiment of the present disclosure, the first connecting part 239a may also be formed in a recessed shape on the substrate 200.

Because the first to third gate electrodes 210, 220, 230 are connected to each other by the first connecting part 239a, the gate contact may not be necessarily in plural number. Accordingly, only one of the first to third gate contacts 310, 330, 350 of FIGS. 1 to 5 may be sufficient. Drawings exemplify and illustrate the second gate contact 330. However, one gate contact may be formed on any one of the connecting part 239a and the first to third upper gate electrodes 210a, 220a, 230a.

The semiconductor device according to an exemplary embodiment of the present disclosure may reduce the number of the gate contacts as the first to third gate electrodes 210, 220, 230 are connected together by the first connecting part 239a. As a result, design margin of an upper wire electrode may be secured more easily, and risk of having problems such as mis-alignment during a process may be lowered.

With simplification of the upper interconnect structure, parasitic capacitance between the interconnect structures may be minimized, and a semiconductor device having higher reliability can thus be provided. Accordingly, a semiconductor device with further enhanced operation characteristics may be provided.

Hereinbelow, the semiconductor device according to an exemplary embodiment of the present disclosure will be described with reference to FIG. 8. In the following description, description overlapped with the exemplary embodiments already provided above will not be described or described briefly for the sake of brevity.

Figure 8:
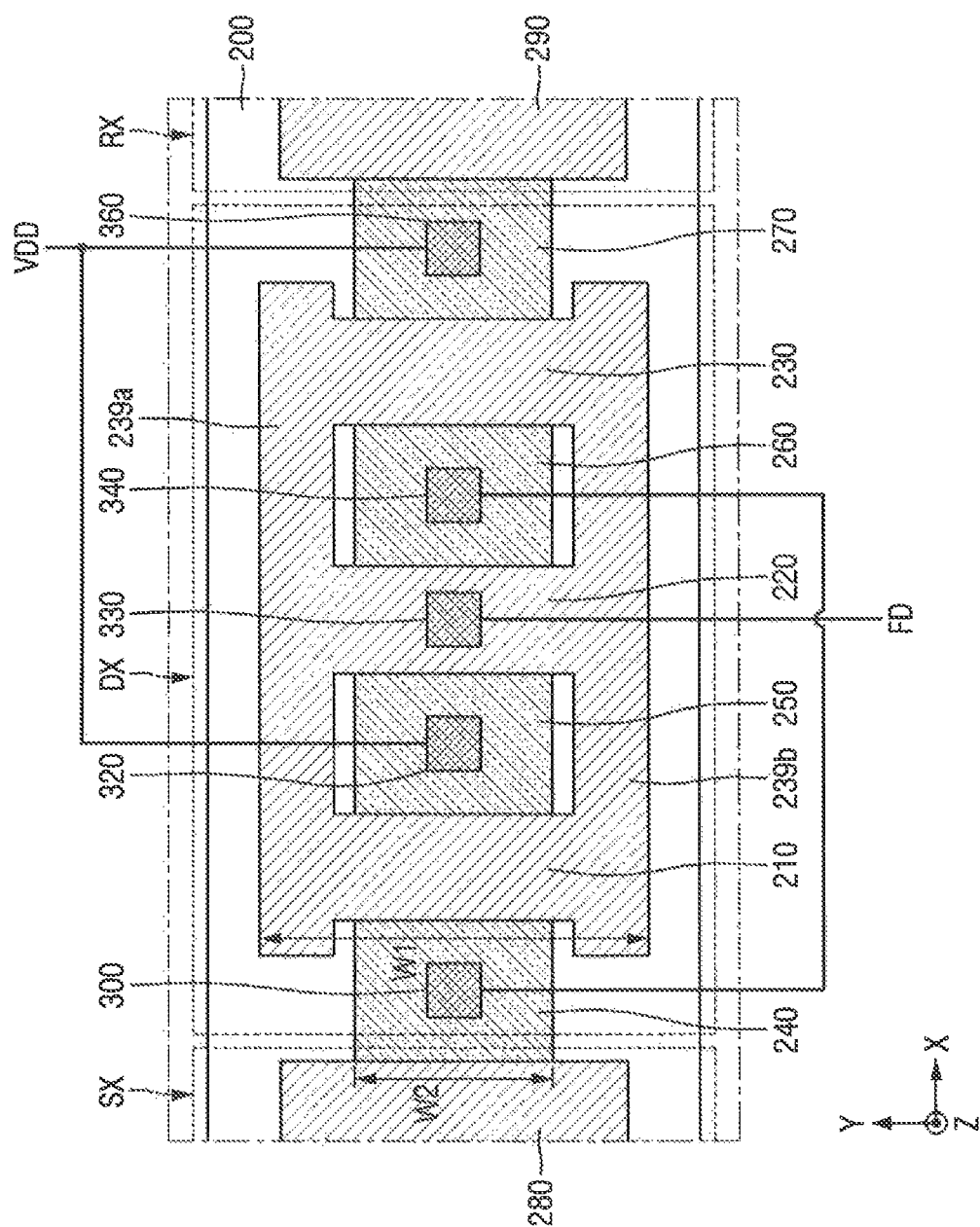
FIG. 8 is a layout view provided to explain a semiconductor device according to an exemplary embodiment of the present disclosure.

FIG. 8 is a layout view provided to explain a semiconductor device according to an exemplary embodiment of the present disclosure.

Referring to FIG. 8, the semiconductor device according to an exemplary embodiment of the present disclosure may additionally include a second connecting part 239b.

The second connecting part 239b together with the first connecting part 239a may connect the first to third gate electrodes 210, 220, 230 as one. The first connecting part 239a, the second connecting part 239b and the first to third gate electrodes 210, 220, 230 may not be separated from each other, but may be formed as one integral structure. That is, the first connecting part 239a, the second connecting part 239b and the first to third gate electrodes 210, 220, 230 may be formed as one integral structure in the same process. Thus, the first connecting part 239a, the second connecting part 239b and the first to third gate electrodes 210, 220, 230 may include the same material.

With the formation of the second connecting part 239b, a structure of the gate electrode may be formed symmetrically. Symmetry of the gate structure is one of important factors to consider, when scale of the semiconductor device decreases. As stress or damage to the gate electrodes varies due to various factors on a process, even the devices with the same specification may exhibit varied performance such as variation in threshold voltage. Such distribution problem should be alleviated or solved, because this can cause considerable damage to the reliability of the semiconductor device.

To solve the problem mentioned above, the semiconductor device according to an exemplary embodiment of the present disclosure may form the second connecting part 239b on a portion corresponding to the first connecting part 239a for obtaining symmetry. Specifically, the second connecting part 239b may be formed opposite the first connecting part 239a in the second direction Y with respect to the first to fourth source/drains 240, 250, 260, 270. Accordingly, a shape of the first connecting part 239a, the second connecting part 239b and the first to third gate electrodes 210, 220, 230 may appear symmetrical with respect to the first to fourth source/drains 240, 250, 260, 270.

The second connecting part 239b may be formed in a stack structure on the substrate 200 as in the first connecting part 239a, or may be formed in a recessed shape.

Hereinbelow, the semiconductor device according to an exemplary embodiment of the present disclosure will be described with reference to FIG. 9. In the following description, description overlapped with the exemplary embodiments already provided above will not be described or described briefly for the sake of brevity.

Figure 9:
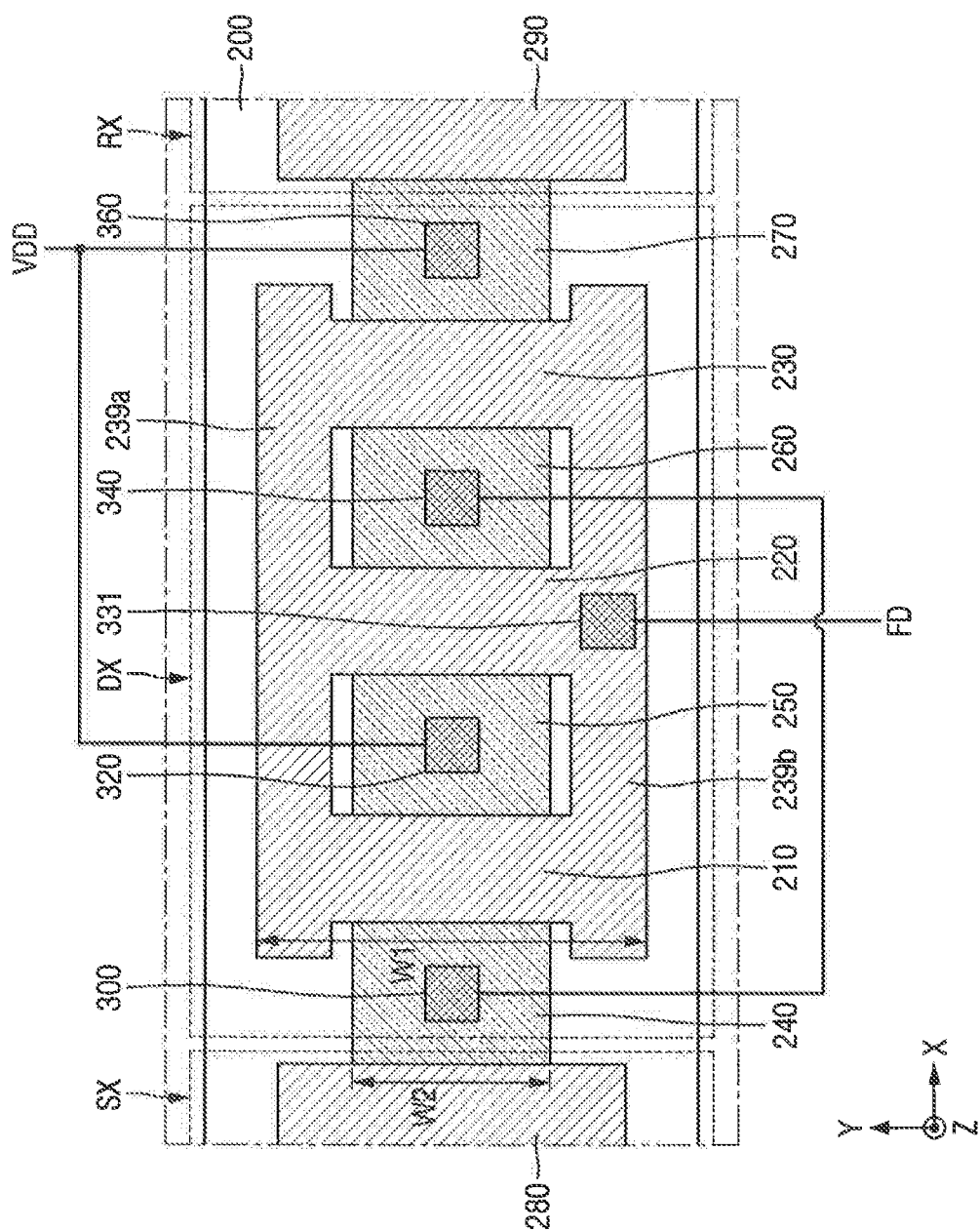
FIG. 9 is a layout view provided to explain a semiconductor device according to an exemplary embodiment of the present disclosure.

FIG. 9 is a layout view provided to explain a semiconductor device according to an exemplary embodiment of the present disclosure.

Referring to FIG. 9, the semiconductor device according to an exemplary embodiment of the present disclosure may include the third gate contact 331.

The third gate contact 331 may be one of the gate contacts provided by way of example among the first to third gate contacts 310, 330, 350 of FIGS. 1 to 5 as mentioned above. The third gate contact 331 may be disposed on the first connecting part 239a or the second connecting part 239b as illustrated, instead of being disposed on the first to third gate electrodes 210, 220, 230. Accordingly, only one gate contact may be formed on any one of the first conducting part 239a, the second conducting part 239b, and the first to third gate electrodes 210, 220, 230.

As described above, the position for forming the third gate contact 331 may be freely determined. Accordingly, designing of the wire formed on an upper portion of the third gate contact 331 may be greatly facilitated. Because the wire should be formed not to overlap each other, the increased freedom of positioning the third gate contact 331 may reduce the difficulty level of a process, and enhance the integration degree of the semiconductor device. Accordingly, this may greatly increase performance of the semiconductor device according to an exemplary embodiment of the present disclosure.

Hereinbelow, a semiconductor device according to an exemplary embodiment of the present disclosure will be described with reference to FIG. 10. In the following description, description overlapped with the exemplary embodiments already provided above will not be described or described briefly for the sake of brevity.

Figure 10:
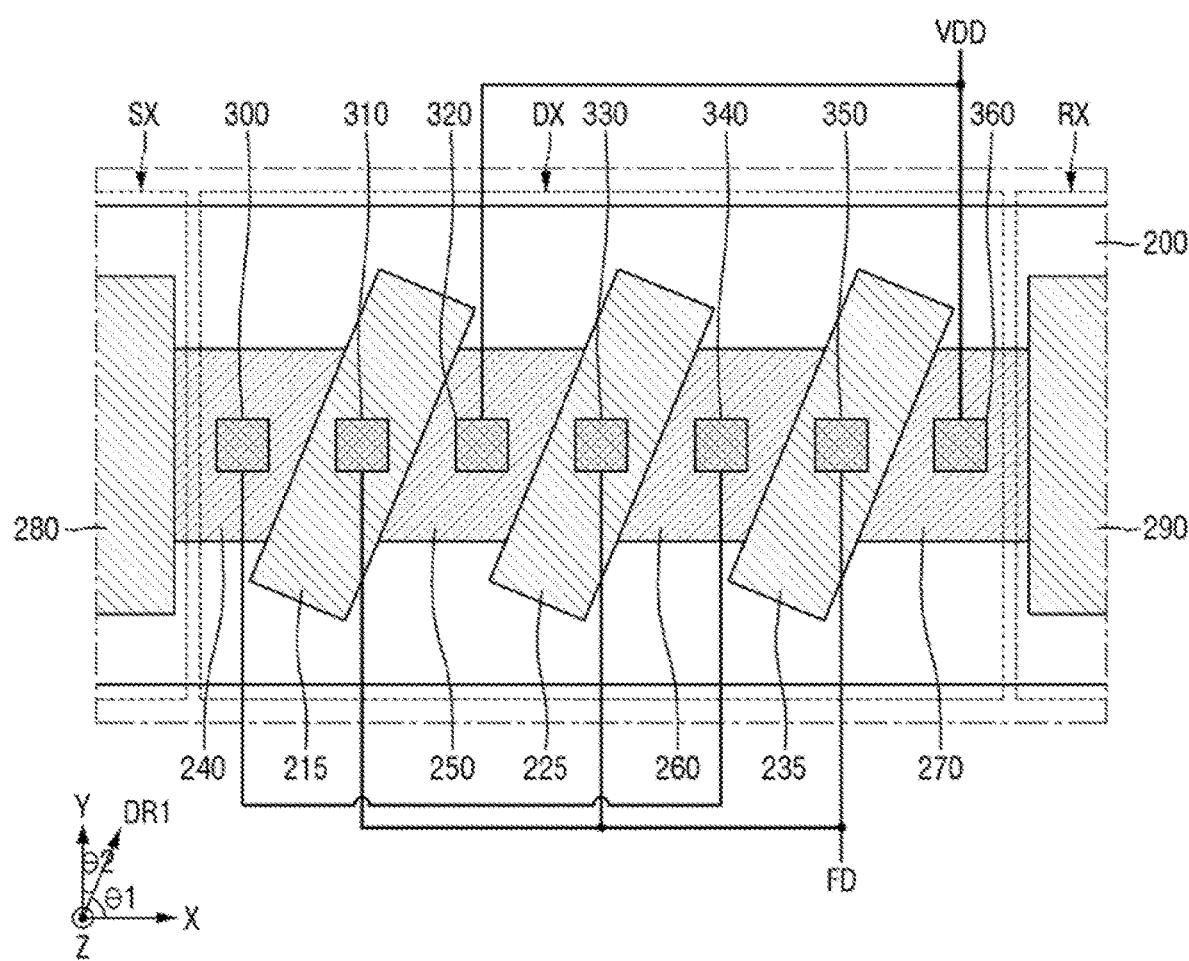
FIG. 10 is a layout view provided to explain a semiconductor device according to an exemplary embodiment of the present disclosure.

FIG. 10 is a layout view provided to explain a semiconductor device according to an exemplary embodiment of the present disclosure.

Referring to FIG. 10, the first to third gate electrodes 215, 225, 235 of the semiconductor device according to an exemplary embodiment of the present disclosure may extend in a fourth direction DR1 intersecting the first direction X and the second direction Y.

The fourth direction DR1 may be inclined at a first acute angle $\theta 1$ with the first direction X, and at a second acute angle $\theta 2$ with the second direction Y. The first acute angle $\theta 1$ and the second acute angle $\theta 2$ defining the fourth direction DR1 may each represent an angle between 00 to 90°. Sum of the first acute angle $\theta 1$ and the second acute angle $\theta 2$ may be 90°. For example, the first acute angle $\theta 1$ and the second acute angle $\theta 2$ may both be 45°.

When the first to third gate electrodes 215, 225, 235 are inclined in the fourth direction DR1, side surfaces of the first to third gate electrodes 215, 225, 235 may face a (100) plane of a silicon lattice of the substrate 200. Accordingly, noise characteristic of the semiconductor device according to an exemplary embodiment of the present disclosure and mobility of a carrier in the channel region may be enhanced. That is, on the substrate 200 including silicon, characteristic of an interface in a direction where the substrate 200 is in contact with the first to third gate electrodes 215, 225, 235 may vary according to a lattice plane.

The first to third gate electrodes 215, 225, 235 may be formed in parallel in the fourth direction DR1 so as to enhance interface characteristic in consideration of the lattice plane. Accordingly, the first to third recesses 210T, 220T, 230T may also be formed in parallel in the fourth direction DR1.

Plane shapes of the first to fourth source/drains 240, 250, 260, 270 described above may vary to a rhombus shape or a trapezoidal shape instead of a rectangular shape.

Hereinbelow, a semiconductor device according to an exemplary embodiment of the present disclosure will be described with reference to FIG. 11. In the following description, description overlapped with the exemplary embodiments already provided above will not be described or described briefly for the sake of brevity.

Figure 11:
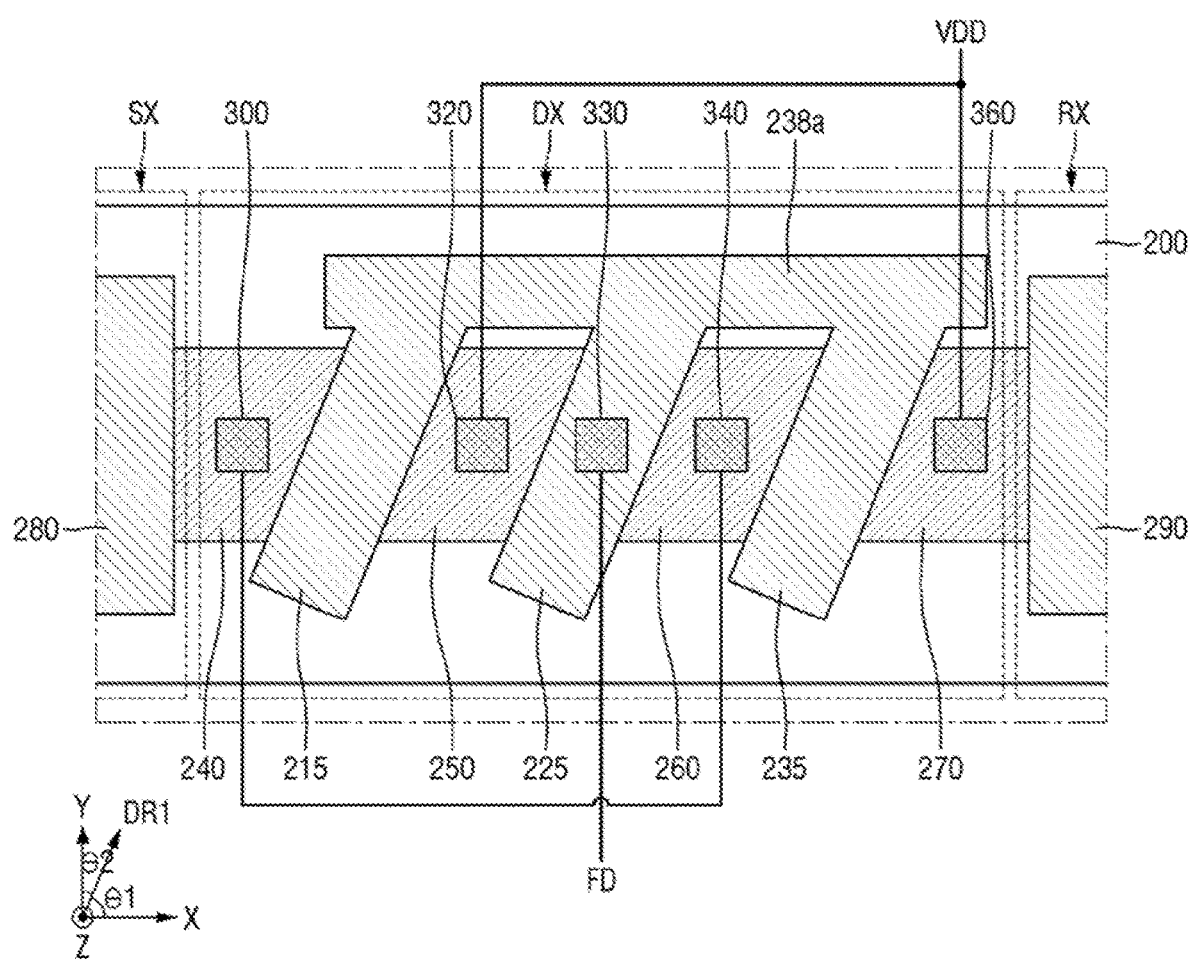
FIG. 11 is a layout view provided to explain a semiconductor device according to an exemplary embodiment of the present disclosure.

FIG. 11 is a layout view provided to explain a semiconductor device according to an exemplary embodiment of the present disclosure.

Referring to FIG. 11, the semiconductor device according to an exemplary embodiment of the present disclosure may additionally include the first connecting part 238a.

The first connecting part 238a may connect the first to third gate electrodes 215, 225, 235 as one. The first connecting part 238a and the first to third gate electrodes 215, 225, 235 may be formed as one integral structure without being separated from each other. That is, the first connecting part 238a and the first to third gate electrodes 215, 225, 235 may be formed as one integral structure in the same process.

Thus, the first connecting part 238*a* and the first to third gate electrodes 215, 225, 235 may include the same material.

The first connecting part 238*a* may be formed on one side surface of the first to fourth source/drains 240, 250, 260, 270 in the second direction Y. Specifically, the first connecting part 238*a* may be formed to entirely overlap the second source/drain 250 and the third source/drain 260 in the second direction Y. Further, the first connecting part 238*a* may be formed to overlap a portion of the first source/drain 240 and the fourth source/drain 270 in the second direction Y. However, the present disclosure is not limited thereto. That is, unlike the illustration, the first connecting part 238*a* may not overlap the first source/drain 240 and the fourth source/drain 270 in the second direction Y. The first connecting part 238*a* may not overlap the first to fourth source/drains 240, 250, 260, 270 in the third direction Z.

In an example, the first connecting part 238*a* may be formed on the substrate 200. The first connecting part 238*a* may have an upper surface having the same height as the upper surfaces of the first gate electrode 215, the second gate electrode 225, and the third gate electrode 235. The first connecting part 238*a* may connect portions of the first to third gate electrodes 215, 225, 235 above the substrate 200. Alternatively, in an exemplary embodiment of the present disclosure, the first connecting part 238*a* may also be formed in a recessed shape on the substrate 200.

Because the first to third gate electrodes 215, 225, 235 are connected to each other with the first connecting part 238*a*, the gate contact may not be necessarily in plural number. Accordingly, only one gate contact among the first to third gate contacts 310, 330, 350 of FIG. 10 is sufficient. Drawings exemplify and illustrate the second gate contact 330. In addition, the only one gate contact may be formed on the first connecting part 238*a*.

The semiconductor device according to an exemplary embodiment of the present disclosure may reduce the number of the gate contacts by the first to third gate electrodes 215, 225, 235 connected to each other, and accordingly, secure design margin and minimize parasitic capacitance.

Hereinbelow, a semiconductor device according to an exemplary embodiment of the present disclosure will be described with reference to FIG. 12. In the following description, description overlapped with the exemplary embodiments already provided above will not be described or described briefly for the sake of brevity.

Figure 12:
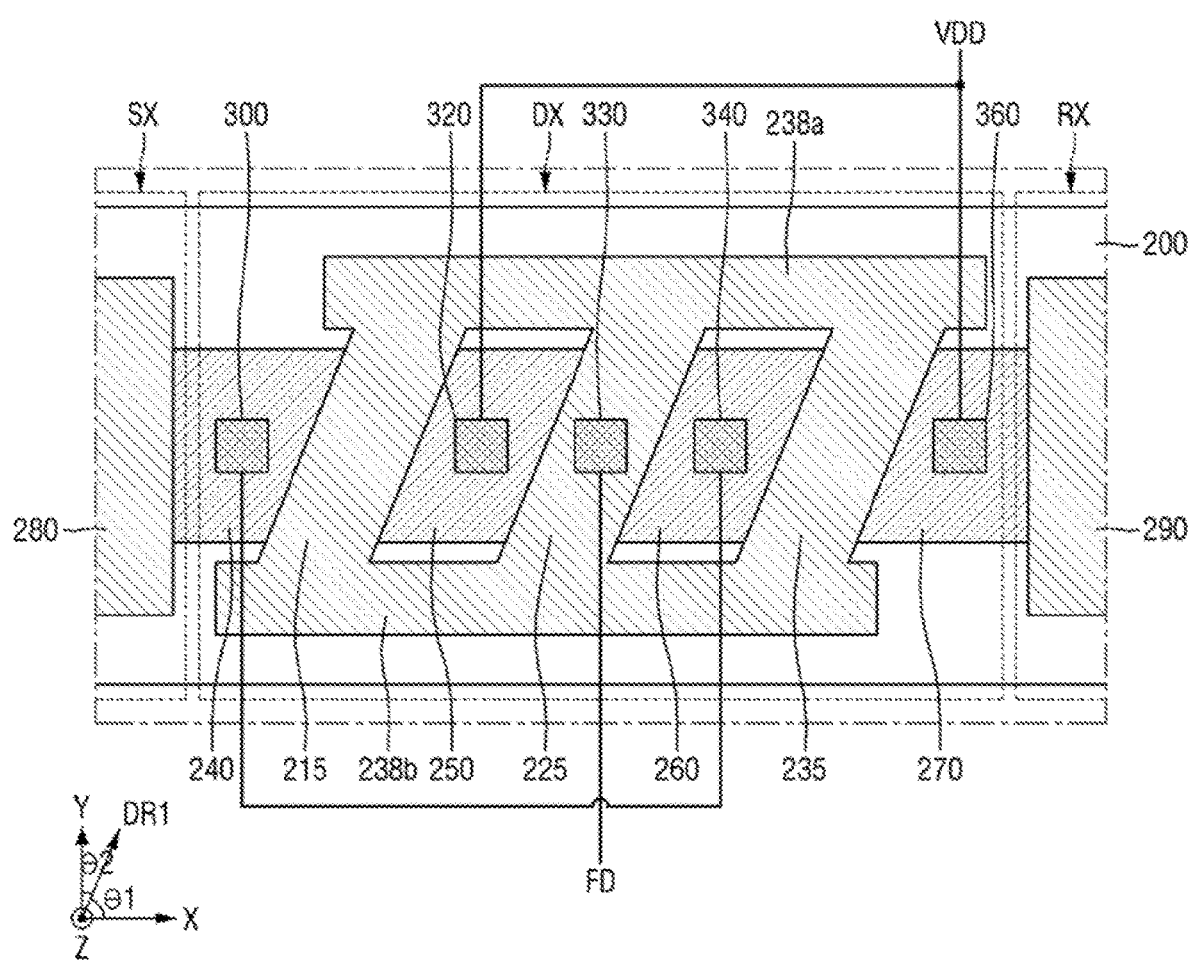
FIG. 12 is a layout view provided to explain a semiconductor device according to an exemplary embodiment of the present disclosure.

FIG. 12 is a layout view provided to explain a semiconductor device according to an exemplary embodiment of the present disclosure.

Referring to FIG. 12, the semiconductor device according to an exemplary embodiment of the present disclosure may additionally include the second connecting part 238*b*.

The second connecting part 238*b* together with the first connecting part 238*a* may connect the first to third gate electrodes 215, 225, 235 as one. The first connecting part 238*a*, the second connecting part 238*b* and the first to third gate electrodes 215, 225, 235 may not be separated from each other, but may be formed as one integral structure. That is, the first connecting part 238*a*, the second connecting part 238*b* and the first to third gate electrodes 215, 225, 235 may be formed as one integral structure in the same process. Thus, the first connecting part 238*a*, the second connecting part 238*b* and the first to third gate electrodes 215, 225, 235 may include the same material.

With formation of the second connecting part 238*b*, a structure of the gate electrode may be formed symmetrically. The second connecting part 238*b* may be formed in a stack structure on the substrate 200 as in the first connecting part 238*a*, or may be formed in a recessed shape.

Hereinbelow, a semiconductor device according to an exemplary embodiment of the present disclosure will be described with reference to FIG. 13. In the following description, description overlapped with the exemplary embodiments already provided above will not be described or described briefly for the sake of brevity.

Figure 13:
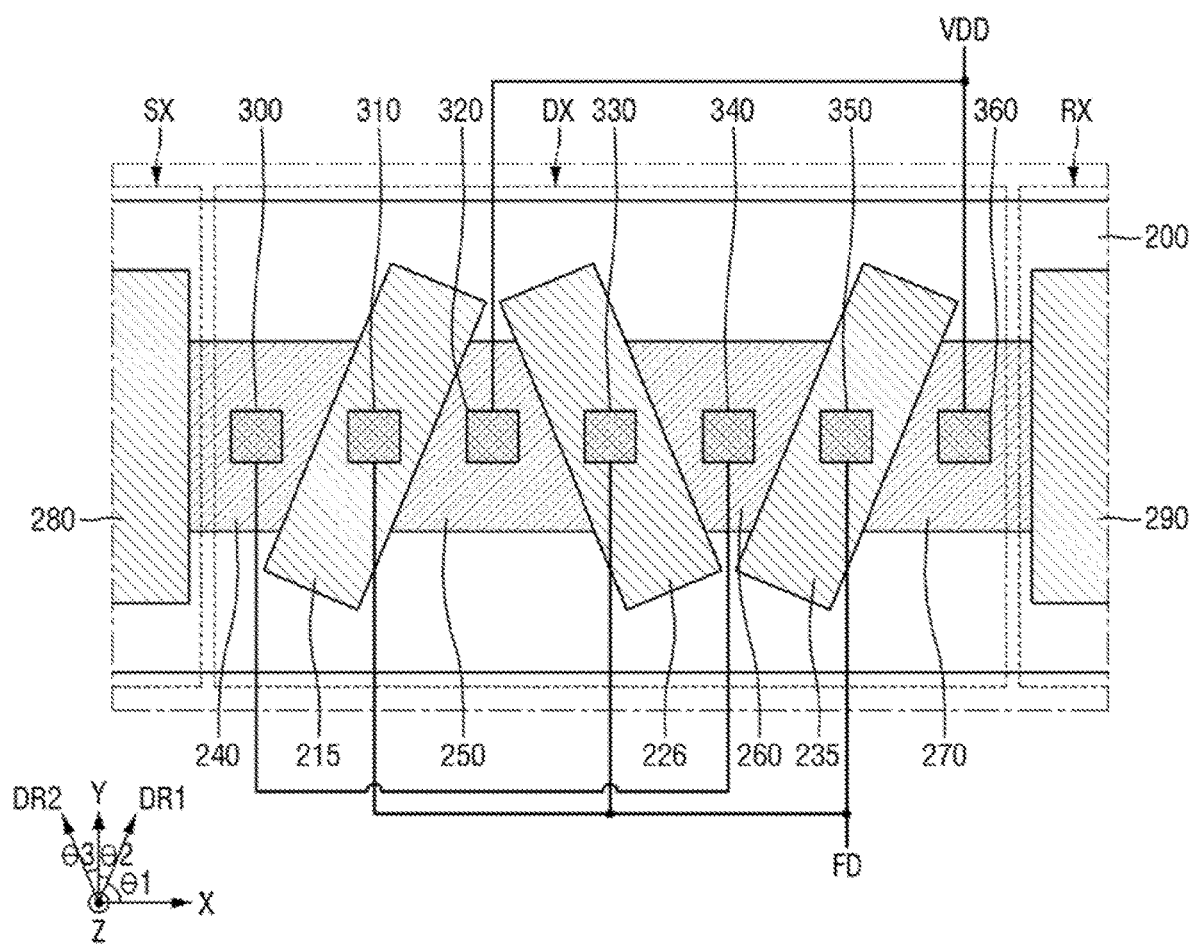
FIG. 13 is a layout view provided to explain a semiconductor device according to an exemplary embodiment of the present disclosure.

FIG. 13 is a layout view provided to explain a semiconductor device according to an exemplary embodiment of the present disclosure.

Referring to FIG. 13, in the semiconductor device according to an exemplary embodiment of the present disclosure, the second gate electrode 226 may extend in a fifth direction DR2 intersecting the first direction X, the second direction Y and the fourth direction DR1.

The fifth direction DR2 may be inclined at a third acute angle $\theta 3$ with the second direction Y. The fifth direction DR2 may be inclined at an obtuse angle $\theta 1+\theta 2+\theta 3$ or $90°+\theta 3$ with the first direction X. The third acute angle $\theta 3$ defining the fifth direction DR2 may represent an angle between 0° to 90°. For example, the third acute angle $\theta 3$ may be 45°.

In the channel region of the first gate electrode 215 and the third gate electrode 235, the interface may be formed on the (100) lattice plane of the substrate 200 including silicon, and therefore, mobility characteristic of the carrier and interface characteristic may be enhanced. Likewise, the second gate electrode 226 may also be formed with the interface on the (100) lattice plane of the silicon substrate, and therefore, mobility characteristic of the carrier and interface characteristic may be enhanced.

When the second gate electrode 226 is inclined in the fifth direction DR2, an entire gate electrode may be disposed in a zigzag shape with the first gate electrode 215 and the third gate electrode 235. The method mentioned above may have more symmetry compared to a form where the first gate electrode 215, the second gate electrode 226, and the third gate electrode 235 are disposed all in the fourth direction DR1. That is, the first gate electrode 215, the second gate electrode 226, and the third gate electrode 235 may operate at more similar threshold voltages.

Hereinbelow, a semiconductor device according to an exemplary embodiment of the present disclosure will be described with reference to FIG. 14. In the following description, description overlapped with the exemplary embodiments already provided above will not be described or described briefly for the sake of brevity.

Figure 14:
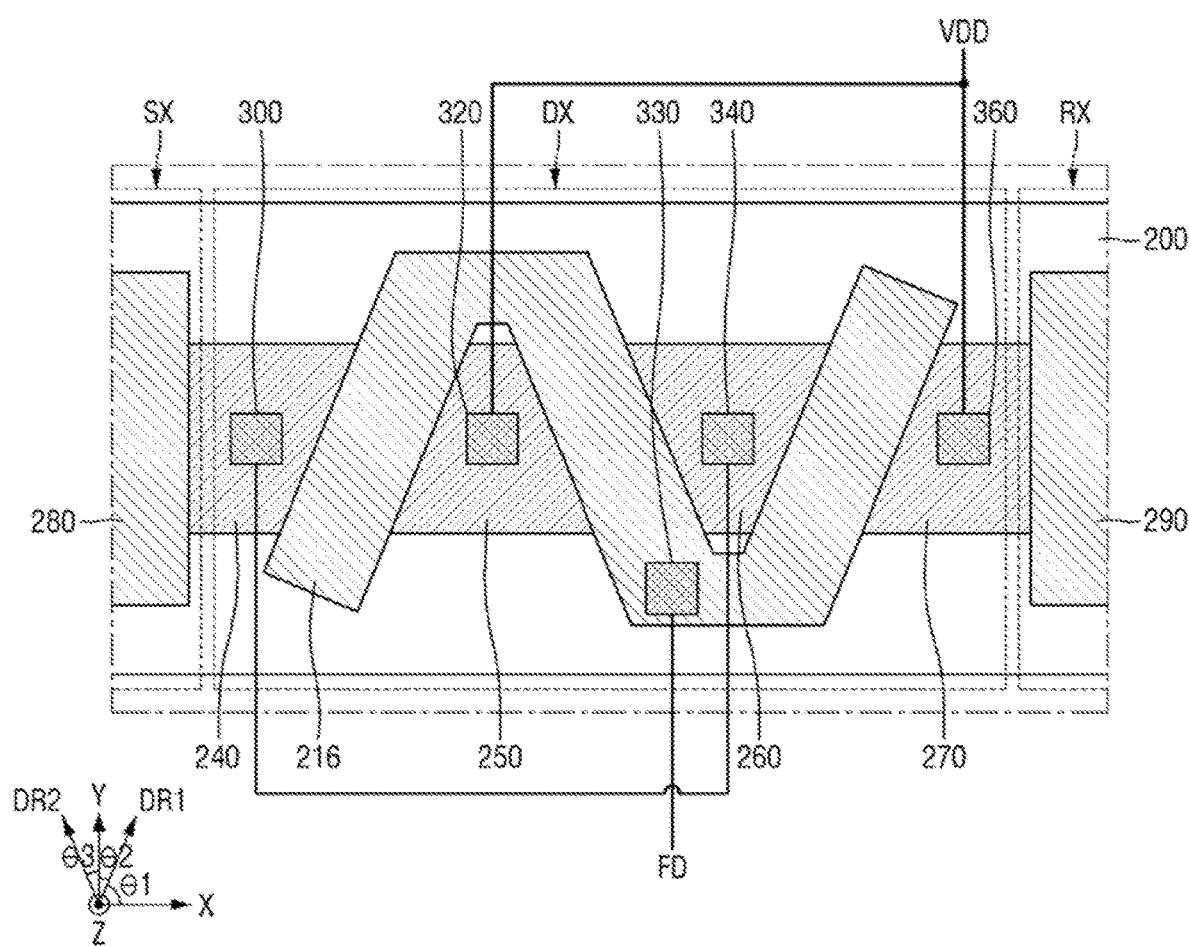
FIG. 14 is a layout view provided to explain a semiconductor device according to an exemplary embodiment of the present disclosure.

FIG. 14 is a layout view provided to explain a semiconductor device according to an exemplary embodiment of the present disclosure.

Referring to FIG. 14, the semiconductor device according to an exemplary embodiment of the present disclosure may include a gate electrode 216.

The gate electrode 216 may be a structure where the first gate electrode 215, the second gate electrode 226, and the third gate electrode 235 of FIG. 13 are merged into one gate electrode 216 as one integral structure.

As the exemplary embodiment described above of FIG. 14, the gate electrode 216 may form an interface with a (100) plane among the silicon lattice planes, and accordingly, mobility characteristic and interface characteristic may be excellent. Further, the zigzag shape exhibits high symmetry, and thus a threshold voltage of each portion may appear uniform.

Because the gate electrodes forming the three parallel transistors are electrically connected, they may as well be integrated to reduce the number of the gate contacts. That is, because only one gate contact may operate as the gate contact of the drive transistor DX as in the second gate contact 330 shown in FIG. 14, space margin of the upper structure may be secured and parasitic capacitance may be minimized.

In the semiconductor device according to an exemplary embodiment of the present disclosure, because the gate electrode 216 may be formed in a zigzag shape, it is very easy to merge the three gate electrodes with each other. That is, without including a separate connecting part as shown in FIG. 12, the gate electrode 216 may be easily formed as an integral structure where ends of the first gate electrode 215, the second gate electrode 226 and the third gate electrode 235 in FIG. 13 are connected.

Hereinbelow, a method for fabricating a semiconductor device according to an exemplary embodiment of the present disclosure will be described with reference to FIGS. 15 to 21. In the following description, description overlapped with the exemplary embodiments already provided above will not be described or described briefly for the sake of brevity.

FIGS. 5 and 15 to 21 are views illustrating intermediate stages of fabrication, provided to explain a method for fabricating a semiconductor device according to an exemplary embodiment of the present disclosure.

Figure 15:
FIGS. 15 to 21 are views illustrating intermediate stages of fabrication, provided to explain a method for fabricating a semiconductor device according to an exemplary embodiment of the present disclosure.

Referring first to FIG. 15, the substrate 200 may be provided.

The substrate 200 may be, for example, a bulk silicon (Si) or a silicon-on-insulator (SOI). Alternatively, the substrate 200 may include other material such as, for example, silicon germanium (SiGe), indium antimonide (InSb), lead telluride (PbTe), indium arsenide (InAs), indium phosphide (InP), gallium arsenide (GaAs), gallium phosphide (GaP), or gallium antimonide (GaSb). Alternatively, the substrate 200 may be a base substrate having an epitaxial layer formed thereon. The epitaxial layer may include one of the above described materials.

Figure 16:
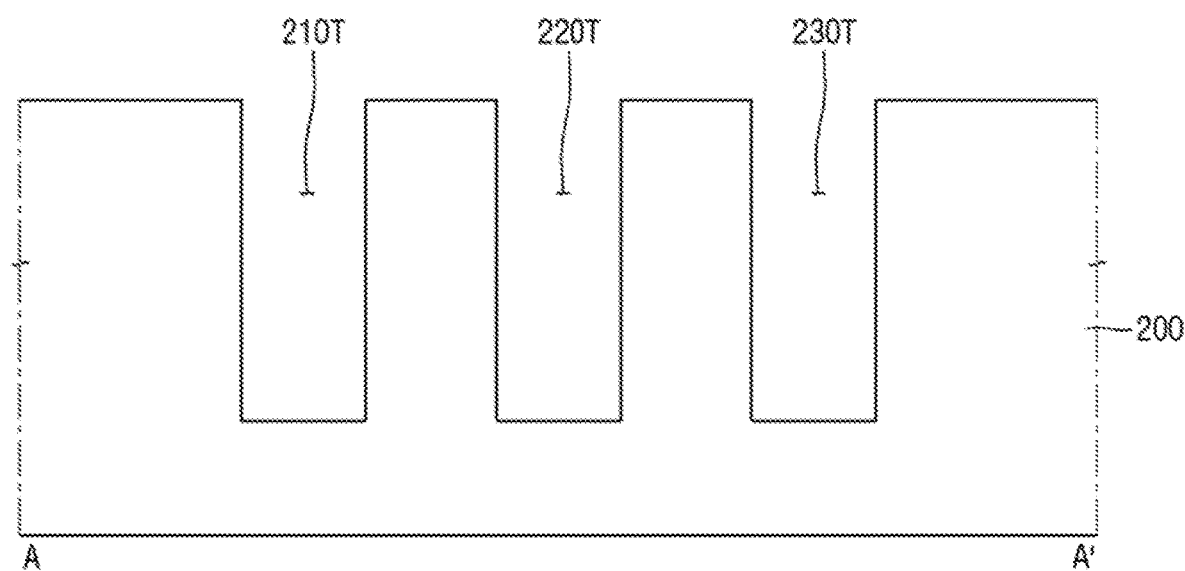

Next, referring to FIG. 16, the first to third recesses 210T, 220T, 230T may be formed on the substrate 200.

The first to third recesses 210T, 220T, 230T may be spaced apart from each other in the first direction X, and may extend in the second direction Y. The first to third recesses 210T, 220T, 230T may be formed downward in the third direction Z within the substrate 200.

In an example, formation of the first to third recesses 210T, 220T, 230T may be performed by wet etching or dry etching.

Figure 17:
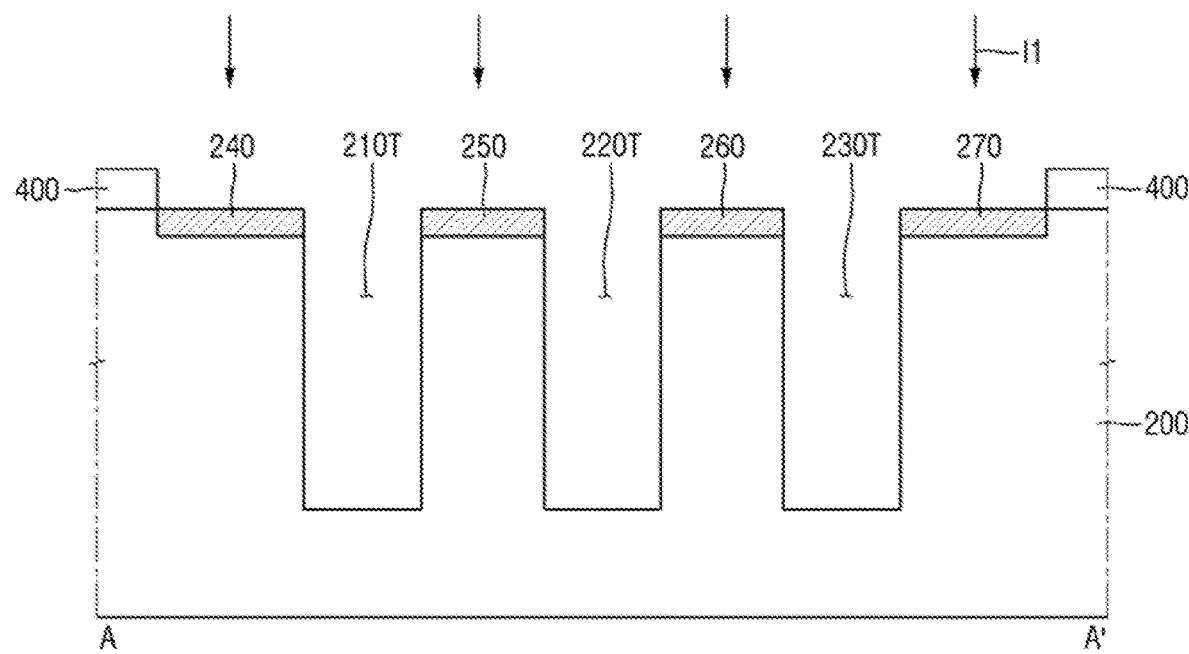

Next, referring to FIG. 17, the first to fourth source/drains 240, 250, 260, 270 may be formed through a first ion implant I1.

The first to fourth source/drains 240, 250, 260, 270 may be formed on one side or between two adjacent ones of the first to third recesses 210T, 220T, 230T. Specifically, the first source/drain 240 may be formed on one side surface of the first recess 210T. The second source/drain 250 may be formed between the first recess 210T and the second recess 220T. The third source/drain 260 may be formed between the second recess 220T and the third recess 230T. The fourth source/drain 270 may be formed on one side of the third recess 230T.

A depth of the lower surfaces of the first to fourth source/drains 240, 250, 260, 270 may be smaller than that of the first to third recesses.

The first ion implant I1 may be performed only on a portion of the upper surface of the substrate 200 not covered by the barrier film 400. The barrier film 400 may be formed on a side surface where the first source/drain 240 is formed and a portion where the select gate electrode 280 is later formed. Further, the barrier film 400 may be formed on a side surface where the fourth source/drain 270 is formed and a portion where the reset gate electrode 290 is later formed.

Figure 18:
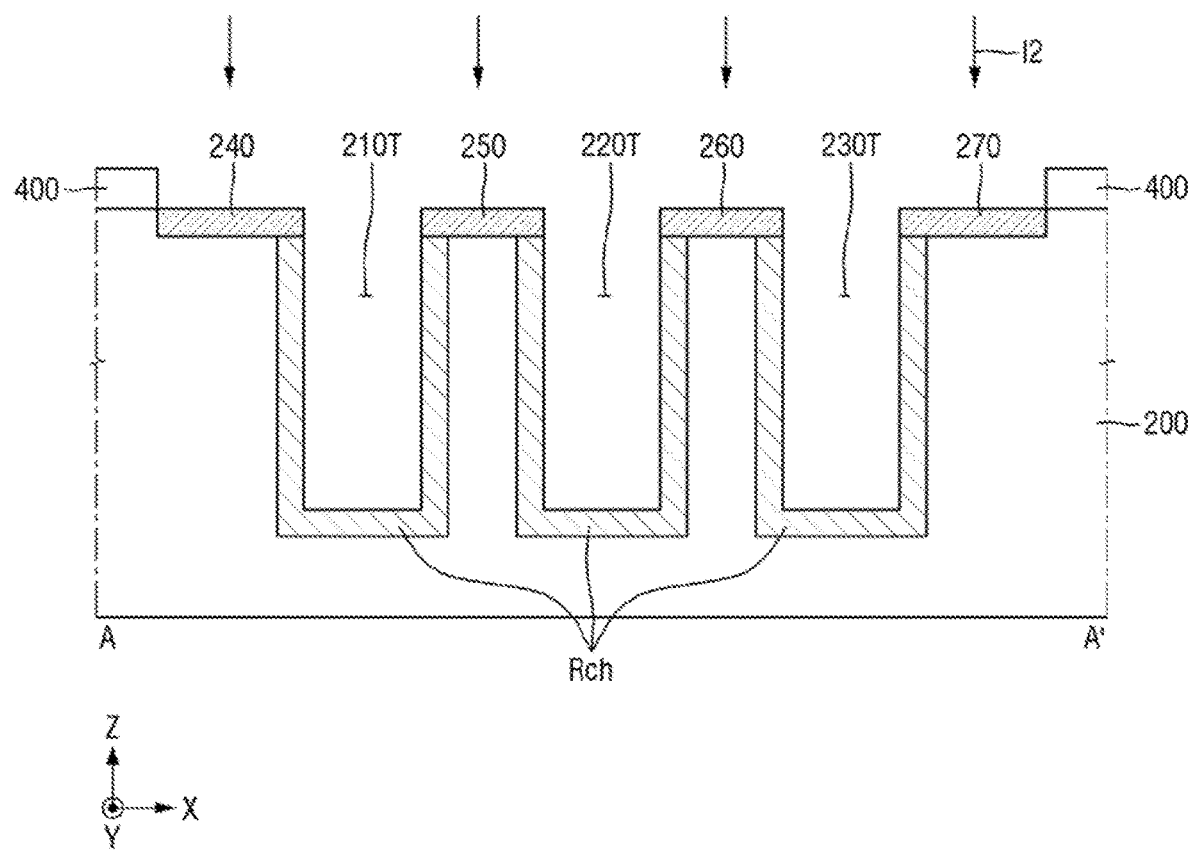

Referring to FIG. 18, doping may be performed on the channel region Rch through a second ion implant I2.

The channel region Rch may be a region from a bottom surface and a sidewall surface of the first to third recesses 210T, 220T, 230T to a certain thickness. The second ion implant I2 for the channel region Rch may be a process to adjust a subsequent threshold voltage of the channel region Rch.

In an example, the first ion implant I1 and the second ion implant I2 may be simultaneously performed with the same process. That is, doping of the channel region Rch may be performed simultaneously upon formation of the first to fourth source/drains 240, 250, 260, 270. Alternatively, a first ion implant I1 may be performed and then a second ion implant I2 different from the first ion implant I1 may be performed.

In following drawings, the channel region Rch will not be illustrated for convenience.

Figure 19:
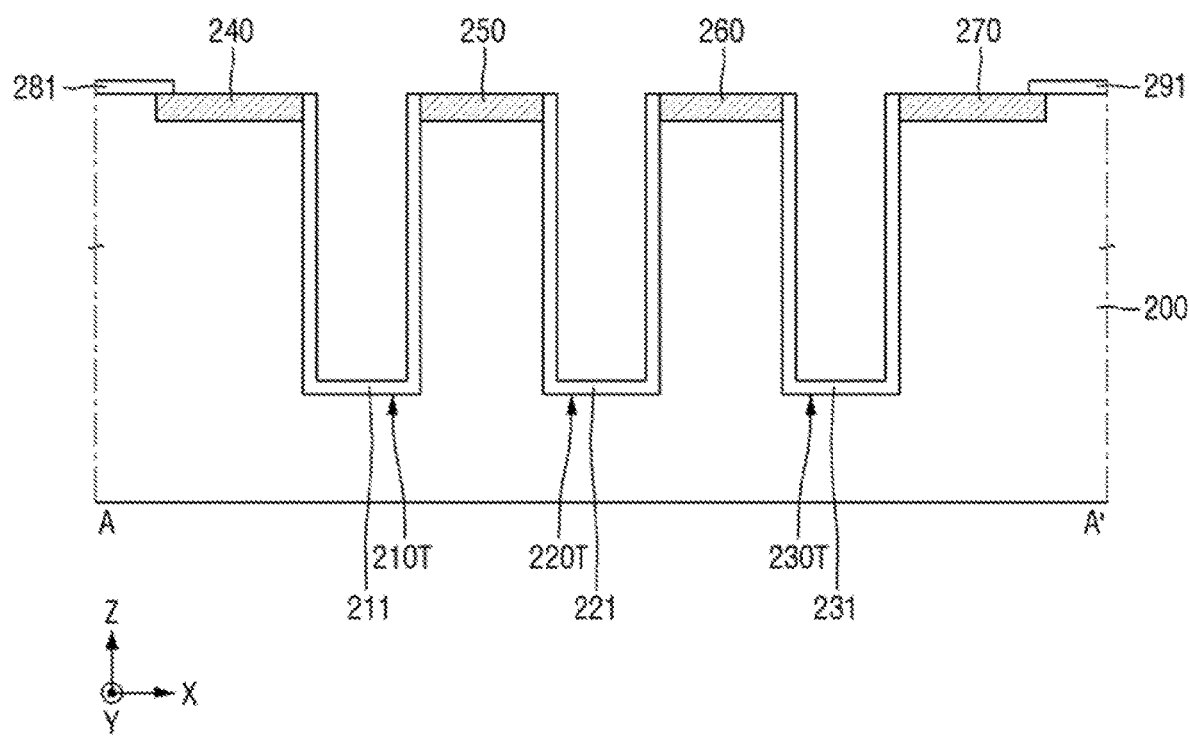

Next, referring to FIG. 19, the first to third gate insulating films 211, 221, 231 may be formed.

The first to third gate insulating films 211, 221, 231 may be formed along a bottom surface and an inner sidewall surface of the first to third recesses 210T, 220T, 230T. The first to third gate insulating films 211, 221, 231 may include silicon oxide ($SiO_2$), or may include other material such as, for example, silicon nitride (SiN), silicon oxynitride (SiON) or a high-k dielectric material with a dielectric constant higher than that of silicon oxide.

In an example, the select gate insulating film 281 and the reset gate insulating film 291 may be formed on the substrate 200. That is, the first to third gate insulating films 211, 221, 231, the select gate insulating film 281 and the reset gate insulating film 291 may be all formed with the same process.

Figure 20:
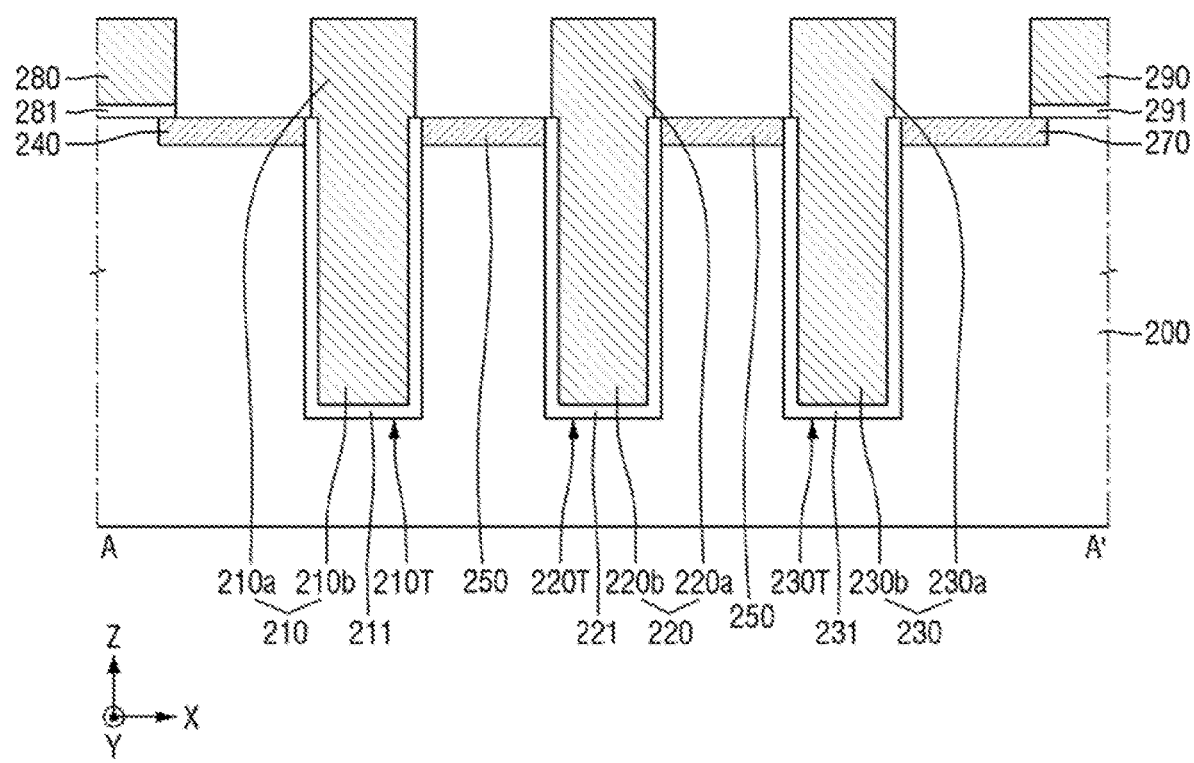

Next, referring to FIG. 20, the first to third gate electrodes 210, 220, 230 are formed.

The first to third gate electrodes 210, 220, 230 may be formed on the first to third recesses 210T, 220T, 230T, respectively.

The first gate electrode 210 may include a first upper gate electrode 210a and a first lower gate electrode 210b. The first lower gate electrode 210b may be a portion filling the first recess 210T, and the first upper gate electrode 210a may be a portion protruding above the substrate 200. In other words, the portion of the first gate electrode 210 lower than the upper surface of the substrate 200 is the first lower gate electrode 210b, and the portion of the first gate electrode 210 higher than the upper surface of the substrate 200 is the first upper gate electrode 210a. That is, the first lower gate electrode 210b may be in contact with the first gate insulating film 211.

The second gate electrode 220 may include the second upper gate electrode 220a and the second lower gate electrode 220b. The second lower gate electrode 220b may be a portion filling the second recess 220T, and the second upper gate electrode 220a may be a portion protruding above the substrate 200. In other words, the portion of the second gate electrode 220 lower than the upper surface of the substrate 200 is the second lower gate electrode 220b, and the portion of the second gate electrode 220 higher than the upper surface of the substrate 200 is the second upper gate electrode 220a. That is, the second lower gate electrode 220b may be in contact with the second gate insulating film 221.

The third gate electrode 230 may include a third upper gate electrode 230a and a third lower gate electrode 230b. The third lower gate electrode 230b may be a portion filling the third recess 230T, and the third upper gate electrode 230a may be a portion protruding above the substrate 200. In other words, the portion of the third gate electrode 230 lower than the upper surface of the substrate 200 is the third lower gate electrode 230b, and the portion of the third gate electrode 230 higher than the upper surface of the substrate 200 is the third upper gate electrode 230a. That is, the third lower gate electrode 230b may be in contact with the third gate insulating film 231.

In an example, the select gate electrode 280 and the reset gate electrode 290 may be formed, respectively. The select gate electrode 280 and the reset gate electrode 290 may be formed on the select gate insulating film 281 and the reset gate insulating film 291, respectively.

Figure 21:
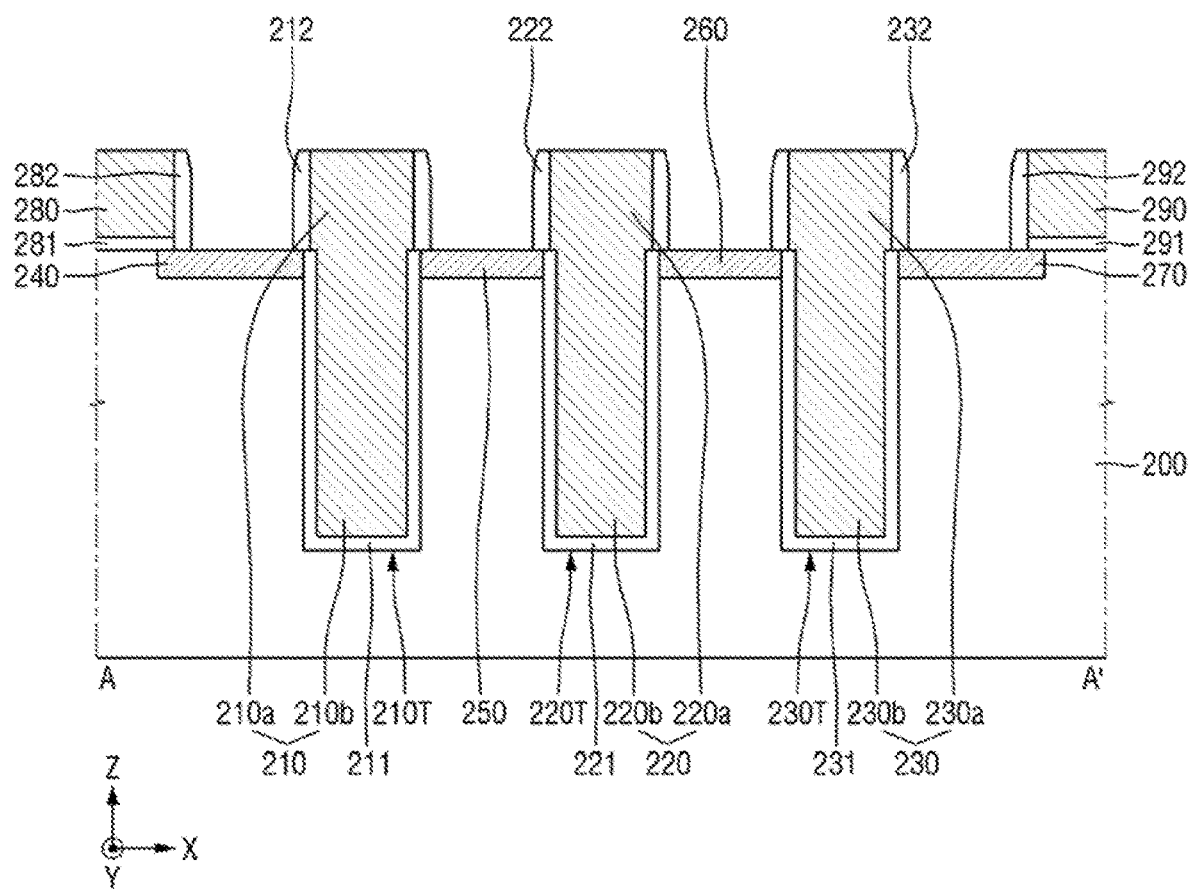

Next, referring to FIG. 21, the first to third gate spacers 212, 222, 232 are formed.

The first to third gate spacers 212, 222, 232 may include at least one of, for example, silicon oxide (SiO$_2$), silicon nitride (SiN), and silicon oxynitride (SiON). However, the present disclosure is not limited thereto. As exemplified in the drawings, the first to third gate spacers 212, 222, 232 may be a single film, but may also be multi-spacers where a plurality of films are stacked. Shapes of the first to third gate spacers 212, 222, 232 and shapes of the multi-spacers forming the first to third gate spacers 212, 222, 232 may each be an I- or an L-shape, or a combination thereof depending on fabrication process or purpose of use. In an example, the select gate spacer 282 and the reset gate spacer 292 may also be formed.

Next, referring to FIG. 5, the first to third gate contacts 310, 330, 350 and the first to fourth source/drain contacts 300, 320, 340, 360 are formed.

The first to third gate contacts 310, 330, 350 may be formed on the first to third gate electrodes 210, 220, 230, respectively. Specifically, the first gate contact 310 may be formed on the first gate electrode 210, the second gate contact 330 may be formed on the second gate electrode 220, and the third gate contact 350 may be formed on the third gate electrode 230.

The first to fourth source/drain contacts 300, 320, 340, 360 may be formed on the first to fourth source/drains 240, 250, 260, 270, respectively. Specifically, the first source/drain contact 300 may be formed on the first source/drain 240, and the second source/drain contact 320 may be formed on the second source/drain 250. Further, the third source/drain contact 340 may be formed on the third source/drain 260, and the fourth source/drain contact 360 may be formed on the fourth source/drain 270.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present exemplary embodiments be considered in all respects as illustrative and not restrictive.

What is claimed is:

1. A semiconductor device, comprising:
   a substrate;
   first and second recesses spaced apart from each other in a first direction within the substrate;
   a first gate electrode filling the first recess and protruding above the substrate;
   a second gate electrode filling the second recess and protruding above the substrate;
   a first source/drain formed between the first and second recesses;
   a second source/drain formed in an opposite direction to the first source/drain with respect to the first recess;
   a third source/drain formed in an opposite direction to the first source/drain with respect to the second recess; and
   a gate contact formed directly on the first and second gate electrodes,
   wherein the first and second gate electrodes are connected to form one integral structure at a same level, are electrically connected to same node and share the gate contact.

2. The semiconductor device of claim 1, wherein depths of the first and second recesses are larger than those of the first to third source/drains.

3. The semiconductor device of claim 1, further comprising:
   a select gate electrode formed on one side of the first and second gate electrodes; and
   a reset gate electrode formed on other side of the first and second gate electrodes.

4. The semiconductor device of claim 3, wherein at least one of the select gate electrode and the reset gate electrode fills a recess formed within the substrate.

5. The semiconductor device of claim 3, wherein the second source/drain is formed between the reset gate electrode and the first gate electrode, and is in contact with the reset gate electrode.

6. The semiconductor device of claim 3, further comprising a fourth source/drain formed on a side surface of the select gate electrode, wherein the fourth source/drain is electrically connected to the first and second gate electrodes.

7. The semiconductor device of claim 1, wherein the first gate electrode comprises a first lower gate electrode filling the first recess and a first upper gate electrode protruding above the substrate,
   the second gate electrode comprises a second lower gate electrode filling the second recess and a second upper gate electrode protruding above the substrate, and
   a height of the first upper gate electrode and a height of the second upper gate electrode are the same as each other.

8. The semiconductor device of claim 7, further comprising:
   a first gate insulating film formed on a sidewall surface and a bottom surface of the first lower gate electrode; and
   a second gate insulating film formed on a sidewall surface and a bottom surface of the second lower gate electrode.

9. A semiconductor device, comprising:
   a photodiode configured to output an electric signal according to incident light;
   a floating diffusion node electrically connected to the photodiode;
   a first transistor configured to apply a reset signal to the floating diffusion node;
   a second transistor structure configured to use voltage of the floating diffusion node as a gate voltage; and
   a third transistor connected to the second transistor structure in series,
   wherein the second transistor structure comprises:
   a substrate;

first and second recesses extending in parallel in a first direction within the substrate and spaced apart in a second direction intersecting the first direction;

a first gate electrode filling the first recess and protruding above the substrate;

a second gate electrode filling the second recess and protruding above the substrate;

a gate contact formed directly on the first and second gate electrodes, wherein the first and second gate electrodes are connected to form one integral structure at a same level and share the gate contact;

a first source/drain formed between the first and second recesses;

a second source/drain formed in an opposite direction to the first source/drain region with respect to the first recess; and a third source/drain formed in an opposite direction to the first source/drain region with respect to the second recess.

10. The semiconductor device of claim 9, wherein the first transistor comprises a reset gate electrode formed on the substrate, and a fourth source/drain formed on a side surface of the reset gate electrode.

11. The semiconductor device of claim 10, further comprising a third recess formed within the substrate, wherein the first recess is disposed between the second recess and the third recess, and the reset gate electrode fills the third recess.

12. The semiconductor device of claim 9, wherein the third transistor comprises a select gate electrode formed on the substrate, and the third source/drain formed on a side surface of the select gate electrode.

13. The semiconductor device of claim 9, wherein the first transistor comprises a reset gate electrode formed on the substrate, the third transistor comprises a select gate electrode formed on the substrate, and the reset gate electrode, the first and second gate electrodes, and the select gate electrode are sequentially disposed in the second direction.

14. A semiconductor device, comprising:

a substrate;

a select gate electrode formed on the substrate;

a reset gate electrode spaced apart from the select gate electrode in a first direction and formed on the substrate;

a plurality of drive gate electrodes formed between the select gate electrode and the reset gate electrode, wherein the plurality of drive gate electrodes fill a plurality of recesses formed within the substrate, respectively;

sources and drains formed on one side or between two adjacent ones of the plurality of drive gate electrodes, the select gate electrode, and the reset gate electrode; and a gate contact formed directly on the plurality of drive gate electrodes, wherein the plurality of drive gate electrodes are connected to form one integral structure at a same level and share the gate contact, the sources and the drains are alternately disposed in the first direction, and the sources are electrically connected to each other, and the drains are electrically connected to each other.

15. The semiconductor device of claim 14, wherein the select gate electrode, the reset gate electrode and the drive gate electrodes extend in parallel in a second direction intersecting the first direction, and lengths of the select gate electrode, the reset gate electrode and the drive gate electrodes are all a first length in the second direction.

* * * * *